(12) United States Patent
Otsuji

(10) Patent No.: US 10,935,825 B2
(45) Date of Patent: Mar. 2, 2021

(54) SUBSTRATE PROCESSING METHOD

(71) Applicant: SCREEN Holdings Co., Ltd., Kyoto (JP)

(72) Inventor: Masayuki Otsuji, Kyoto (JP)

(73) Assignee: SCREEN Holdings Co., Ltd.

( * ) Notice: Subject to any disclaimer, the term of this patent is extended or adjusted under 35 U.S.C. 154(b) by 232 days.

(21) Appl. No.: 16/066,789

(22) PCT Filed: Jan. 18, 2017

(86) PCT No.: PCT/JP2017/001552
§ 371 (c)(1),
(2) Date: Jun. 28, 2018

(87) PCT Pub. No.: WO2017/130814
PCT Pub. Date: Aug. 3, 2017

(65) Prior Publication Data
US 2019/0011734 A1   Jan. 10, 2019

(30) Foreign Application Priority Data
Jan. 28, 2016   (JP) .............................. JP2016-014567

(51) Int. Cl.
*G02F 1/1333*   (2006.01)
*H01L 21/02*   (2006.01)
(Continued)

(52) U.S. Cl.
CPC .............. *G02F 1/1333* (2013.01); *G11B 5/84* (2013.01); *G11B 5/8404* (2013.01); *G11B 7/26* (2013.01);
(Continued)

(58) Field of Classification Search
None
See application file for complete search history.

(56) References Cited

U.S. PATENT DOCUMENTS

| | | | |
|---|---|---|---|
| 5,843,627 A * | 12/1998 | Bok | ....................... G03F 7/3021 |
| | | | 430/328 |
| 2004/0060190 A1 | 4/2004 | Lee | .................................. 34/59 |

(Continued)

FOREIGN PATENT DOCUMENTS

| | | |
|---|---|---|
| JP | 2004-128495 A | 4/2004 |
| JP | 2008-078329 A | 4/2008 |

(Continued)

OTHER PUBLICATIONS

International Preliminary Report on Patentability (Chapter I) with a Notification from the International Bureau Form PCT/IB/326 for International Application No. PCT/JP2017/001552 dated Aug. 9, 2018, 6 pages.

(Continued)

*Primary Examiner* — Eric W Golightly
*Assistant Examiner* — Arlyn I Rivera-Cordero
(74) *Attorney, Agent, or Firm* — Ostrolenk Faber LLP

(57) ABSTRACT

A substrate processing method includes a first discharge step of discharging, from the first discharge port which faces a predetermined first region including the rotating center of the upper surface, a low surface tension liquid containing gas containing steam of a low surface tension liquid having a larger specific gravity than air and lower surface tension than the processing liquid and not discharging the low surface tension liquid containing gas from the second discharge port which faces a predetermined second region surrounding the outside of the first region on the upper surface of the substrate, and a second discharge step of discharging the low surface tension liquid containing gas from the second discharge port after the first discharge step and not discharging the low surface tension liquid containing gas from the first discharge port.

6 Claims, 15 Drawing Sheets

(51) Int. Cl.
  *H01L 21/67* (2006.01)
  *G11B 5/84* (2006.01)
  *G11B 7/26* (2006.01)
  *H01L 21/306* (2006.01)

(52) U.S. Cl.
  CPC .. *H01L 21/02057* (2013.01); *H01L 21/30604* (2013.01); *H01L 21/67028* (2013.01); *H01L 21/67034* (2013.01); *H01L 21/67051* (2013.01)

(56) References Cited

U.S. PATENT DOCUMENTS

| | | | |
|---|---|---|---|
| 2008/0066783 A1 | 3/2008 | Tanaka | 134/21 |
| 2008/0190454 A1 | 8/2008 | Eitoku | 134/19 |
| 2009/0101181 A1 | 4/2009 | Morisawa et al. | 134/94.1 |
| 2010/0101497 A1* | 4/2010 | Izuta | H01L 21/67028 118/730 |
| 2010/0293806 A1* | 11/2010 | Liu | C11D 11/0041 34/239 |
| 2016/0256901 A1* | 9/2016 | Kobayashi | B05B 1/14 |

FOREIGN PATENT DOCUMENTS

| | | |
|---|---|---|
| JP | 2008-198741 A | 8/2008 |
| JP | 2013-131783 A | 7/2013 |

OTHER PUBLICATIONS

English translation of the International Preliminary Report on Patentability (Chapter I) with a Notification from the International Bureau Form PCT/IB/338 International Application No. PCT/JP2017/001552 dated Aug. 9, 2018, 7 pages.

International Search Report dated Feb. 28, 2017 in corresponding PCT International Application No. PCT/JP2017/001552, 5 pages.

Written Opinion dated Feb. 28, 2017 in corresponding PCT International Application No. PCT/JP2017/001552, 4 pages.

* cited by examiner

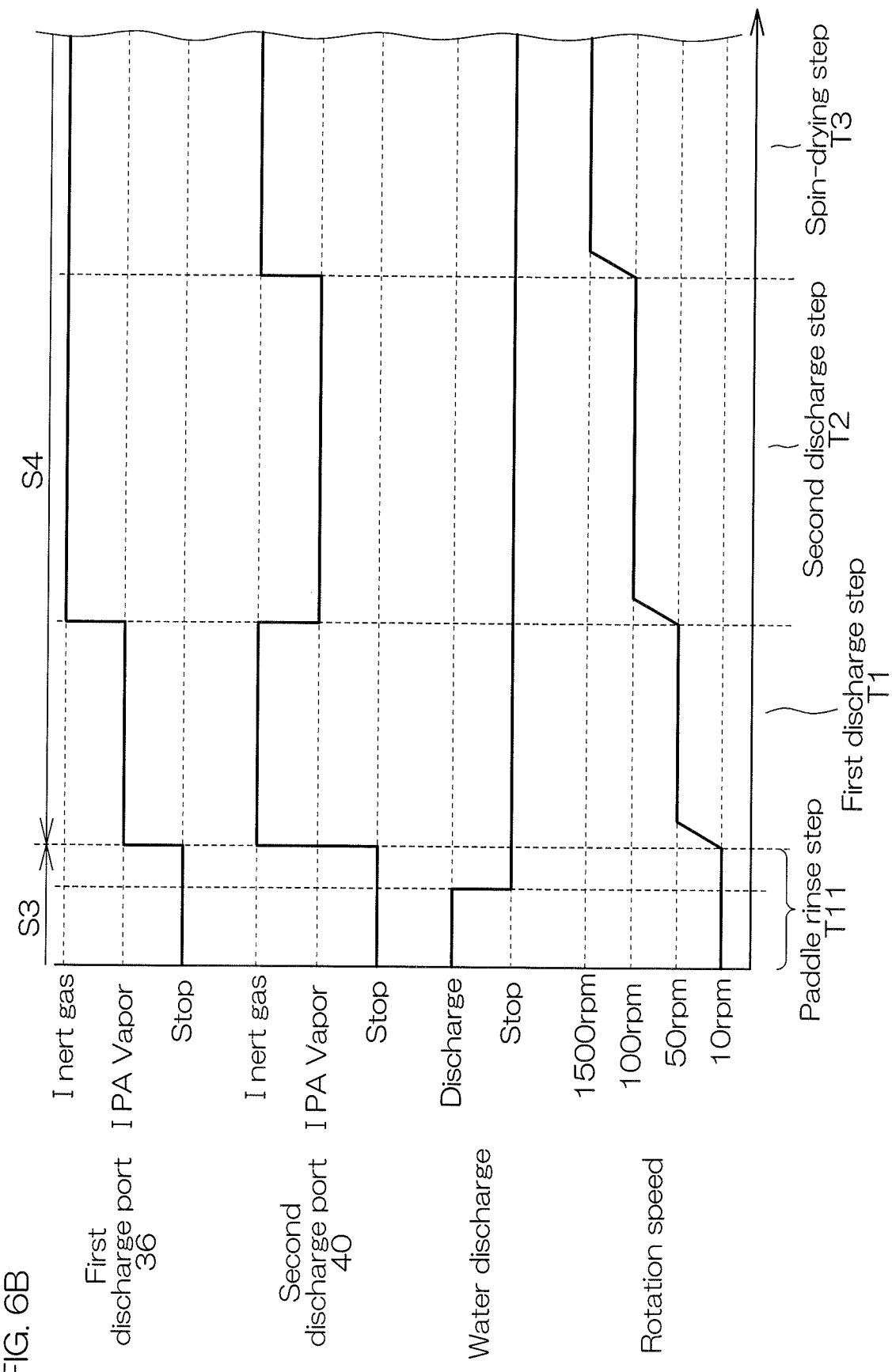

FIG. 7  Paddle rinse step T11
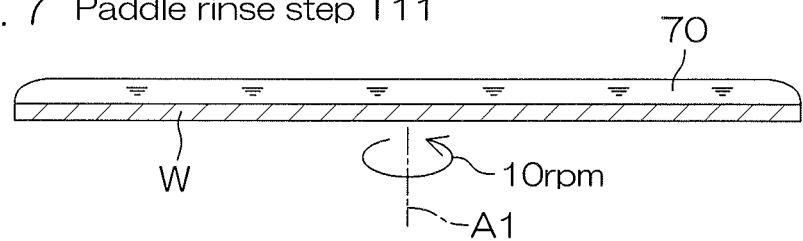
FIG. 8  Paddle rinse step T11
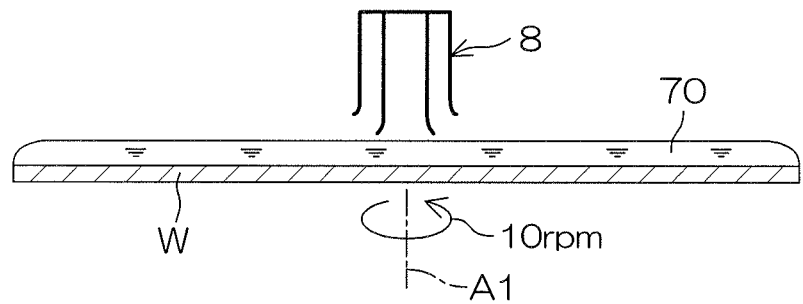

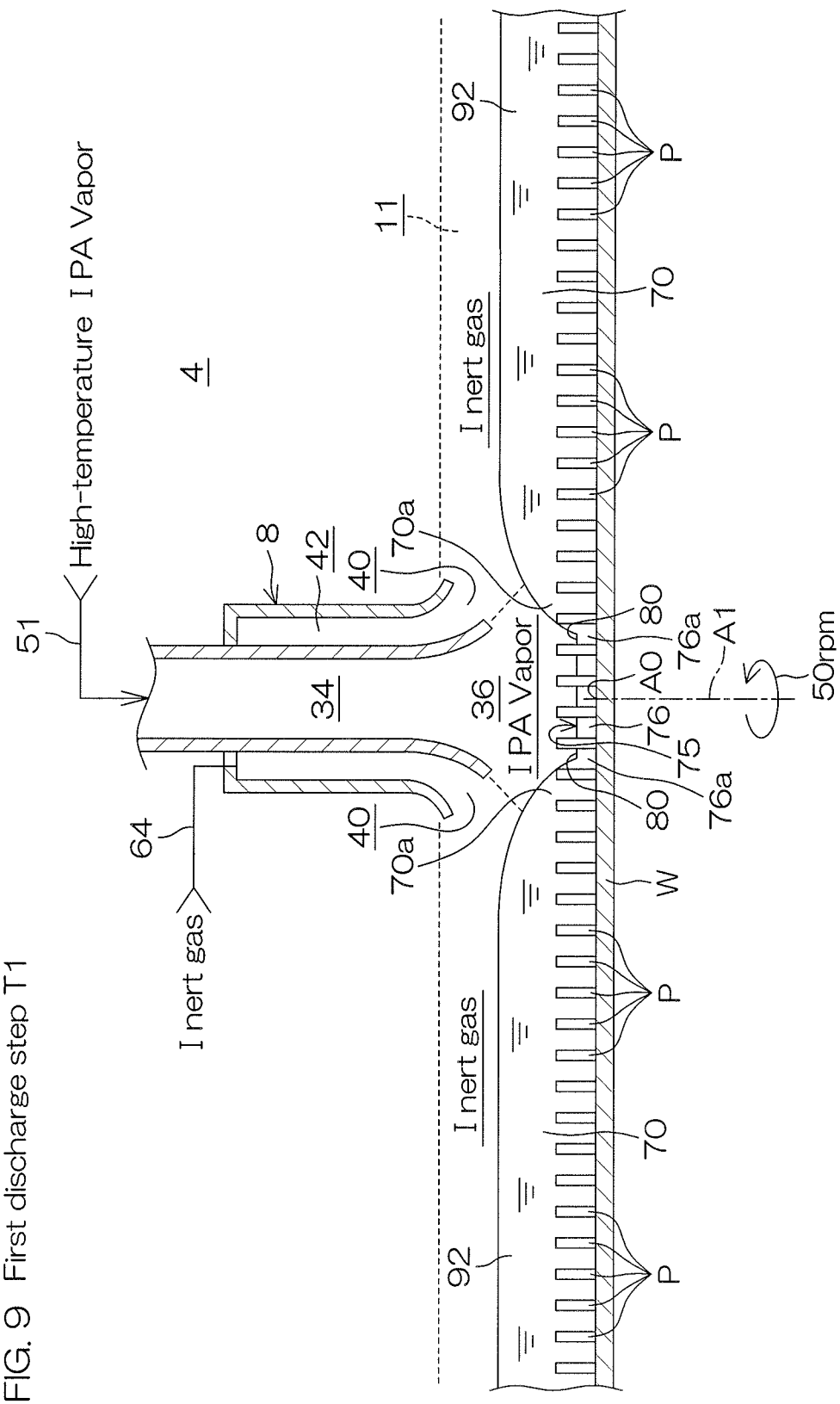
FIG. 9  First discharge step T1

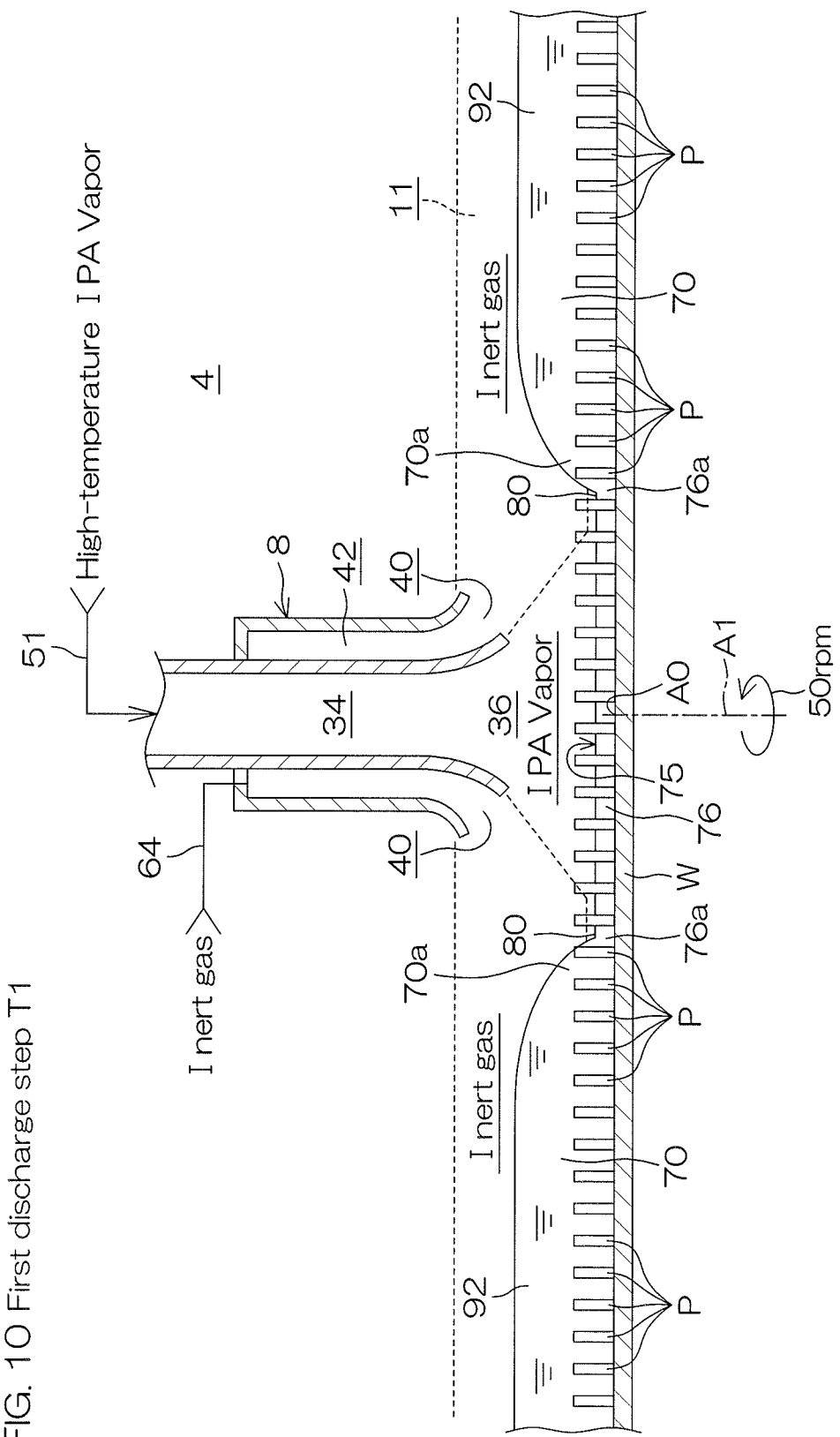
FIG. 10 First discharge step T1

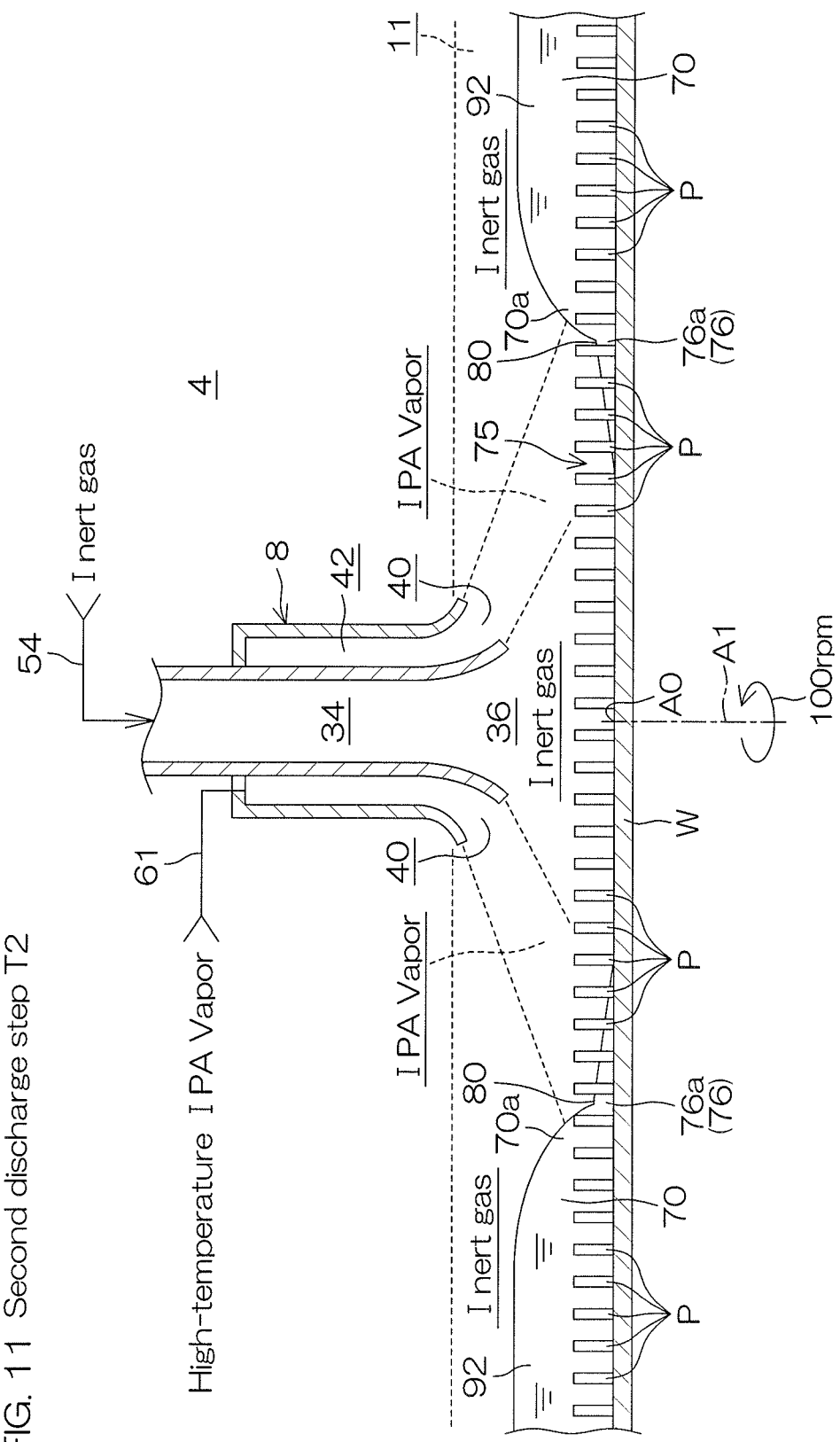
FIG. 11 Second discharge step T2

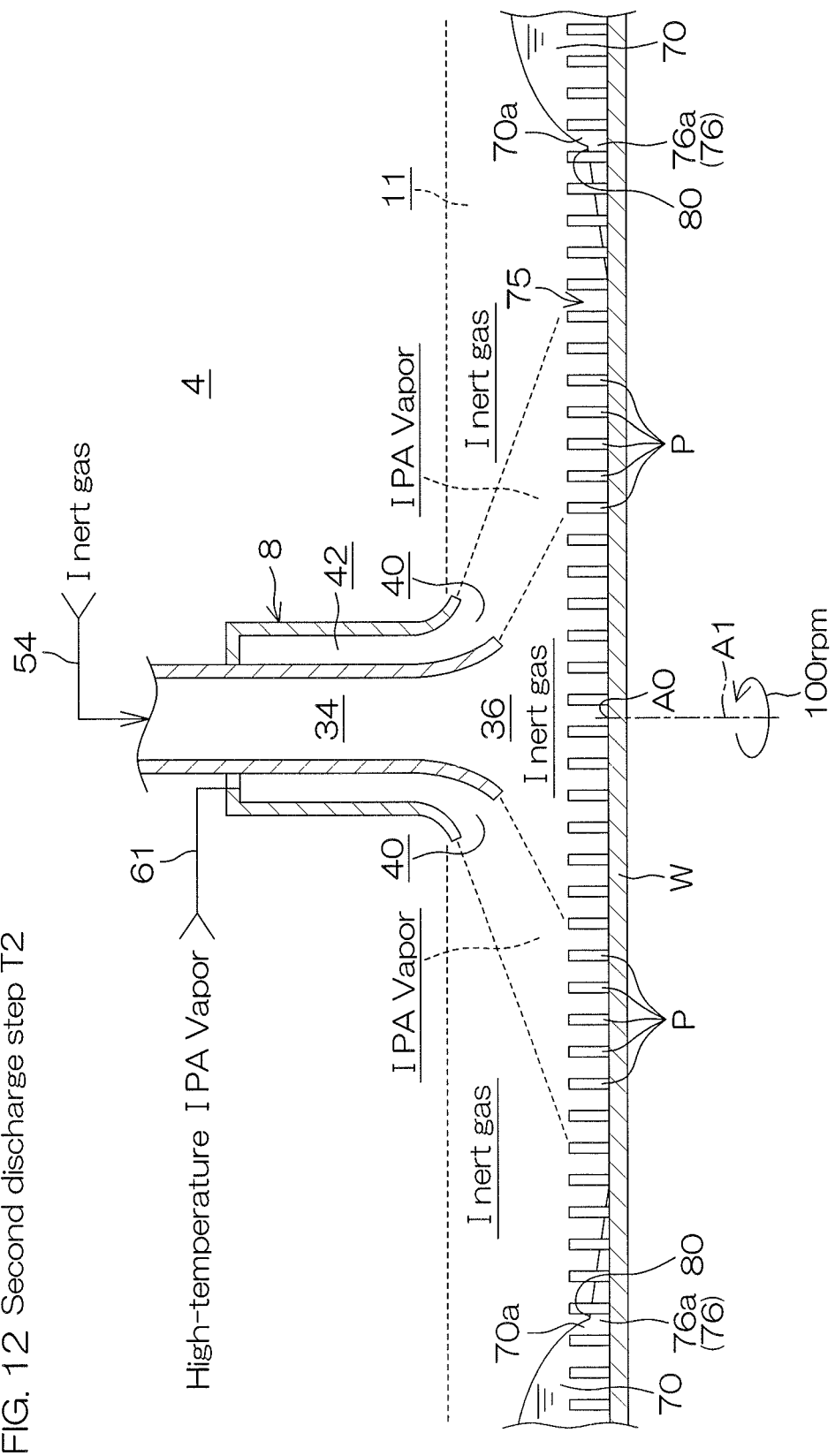
FIG. 12 Second discharge step T2

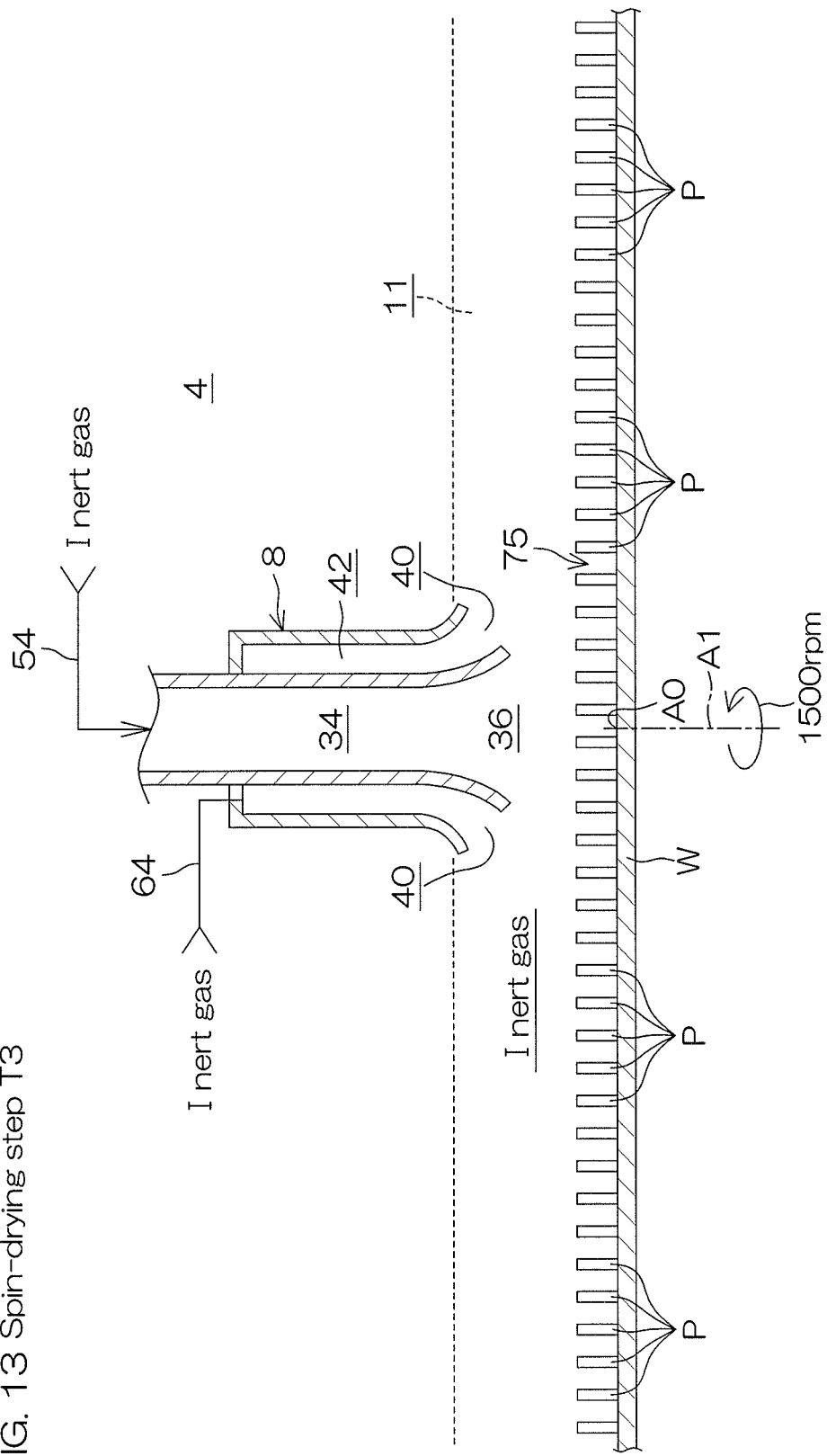
FIG. 13 Spin-drying step T3

SUBSTRATE PROCESSING METHOD

CROSS-REFERENCE TO RELATED APPLICATIONS

The present application is a 35 U.S.C. §§ 371 national phase conversion of PCT/JP2017/001552, filed Jan. 18, 2017, which claims priority to Japanese Patent Application No. 2016-014567, filed Jan. 28, 2016, the contents of both of which are incorporated herein by reference. The PCT International Application was published in the Japanese language.

TECHNICAL FIELD

The present invention relates to a substrate processing method of processing the upper surface of a substrate by using a processing liquid. Examples of substrates include semiconductor wafers, substrates for liquid crystal displays, substrates for plasma displays, substrates for field emission displays (FEDs), substrates for optical disks, substrates for magnetic disks, substrates for magneto-optical disks, substrates for photomasks, ceramic substrates, and substrates for solar cells, etc.

BACKGROUND ART

In a manufacturing process for a semiconductor device, a processing liquid is supplied onto the front surface of a substrate of a semiconductor wafer or the like, and the surface of the substrate is processed by using the processing liquid.

For example, a single substrate processing type substrate processing apparatus that processes substrates one by one includes a spin chuck that rotates a substrate while holding it almost horizontally and a nozzle that supplies a processing liquid onto the upper surface of a substrate rotated by the spin chuck. For example, a chemical liquid is supplied to the substrate held by the spin chuck, and water is subsequently supplied to the substrate, thereby replacing the chemical liquid on the substrate with a rinse liquid. Thereafter, a drying process is performed to remove water from the upper surface of the substrate. As a drying process, a method of supplying steam of a low surface tension liquid such as isopropyl alcohol (IPA) onto the front surface of a substrate in a rotating state is known. For example, rotagoni drying (see patent literature 1) is one of such methods.

CITATION LIST

Patent Literature

Patent literature 1: Japanese Unexamined Patent Application Publication No. 2013-131783

SUMMARY OF THE INVENTION

Technical Problem

More specifically, such a drying method is performed as follows. A liquid film of a processing liquid (water) is formed on the upper surface of a substrate. A low surface tension liquid containing gas (steam of a low surface tension liquid) is sprayed on the liquid film of the processing liquid to form a liquid film removed region. The liquid film removed region is expanded to cover the entire upper surface of the substrate with the liquid film removed region to move the boundary (hereinafter referred to as "liquid film boundary") between the liquid film of the processing liquid and the liquid film removed region from a central portion of the substrate to the peripheral edge of the substrate, thereby drying the upper surface of the substrate.

The present inventors have found that in adopting such a drying method, a processing liquid present between patterns can be removed in a very short time by moving the liquid film boundary while maintaining a large angle (hereinafter referred to as "liquid level angle at the liquid film boundary") defined by the liquid level of the processing liquid and the substrate upper surface at the liquid film boundary. Since the time taken to remove the processing liquid present between patterns shortens at the time of drying, it is possible to further suppress pattern collapse at the time of drying. Therefore, the present inventors have paid attention to the above method as a drying method that can suppress pattern collapse.

In the method described in patent literature 1, however, as a liquid film removed region expands, the liquid film boundary moves away from a discharge port. Therefore, as a liquid film removed region expands, it becomes difficult to keep the periphery of the liquid film boundary in an atmosphere of a low surface tension liquid containing gas. In this case, it is not possible to keep a large liquid level angle at the liquid film boundary. This leads to the possibility of pattern collapse accompanying the expansion of the liquid film removed region.

It is, therefore, an object of the present invention to provide a substrate processing method that can keep supplying a low surface tension liquid containing gas to the boundary between a liquid film of a processing liquid and a liquid film removed region over a period from the formation of a liquid film removed region to the expansion of the liquid film removed region over the entire upper surface of the substrate, thereby removing the processing liquid from the upper surface of the substrate while suppressing or preventing pattern collapse.

Solution to Problem

This invention provides a substrate processing method including a substrate holding step of horizontally holding a substrate having an upper surface on which patterns are formed, a liquid film forming step of forming a liquid film of a processing liquid thicker than the height of the patterns on the upper surface of the substrate, a discharge port disposition step of disposing a first discharge port and a second discharge port such that the first discharge port faces a predetermined first region including the rotating center of the upper surface of the substrate and the second discharge port faces a predetermined second region surrounding the outside of the first region on the upper surface of the substrate, a first discharge step of discharging, from the first discharge port, a low surface tension liquid containing gas containing steam of a low surface tension liquid having a larger specific gravity than air and lower surface tension than the processing liquid and not discharging the low surface tension liquid containing gas from the second discharge port, a second discharge step of discharging the low surface tension liquid containing gas from the second discharge port after the first discharge step and not discharging the low surface tension liquid containing gas from the first discharge port, and a rotation step of rotating the substrate around a predetermined vertical axis in parallelin parallel with the first and second discharge steps.

According to this method, in the first discharge step, a low surface tension liquid containing gas is discharged from the first discharge port, while no low surface tension liquid containing gas is discharged from the second discharge port. That is, in the first discharge step, a low surface tension liquid containing gas is discharged toward the first region on the substrate upper surface, while no low surface tension liquid containing gas is discharged toward the second region surrounding the first region. Further, in the second discharge step after the first discharge step, a low surface tension liquid containing gas is discharged from the second discharge port, while no low surface tension liquid containing gas is discharged from the first discharge port. That is, in the second discharge step, no low surface tension liquid containing gas is discharged toward the first region on the substrate upper surface, while the low surface tension liquid containing gas is discharged toward the second region surrounding the first region.

In the first discharge step, while a substrate is rotated, a low surface tension liquid containing gas is discharged toward a region including the rotating center of the upper surface of the substrate. As the rotation speed of the substrate increases, upon reception of the centrifugal force generated by the rotation of the substrate, a processing liquid in the region including the rotating center of the upper surface of the substrate is spread outward. As a result, the liquid film of the processing liquid is partially thinned. This forms a liquid film removed region in the region including the rotating center of the upper surface of the substrate. The liquid film removed region holds a thin film of the processing liquid which is continuous with a portion near the liquid film boundary (hereinafter referred to as "liquid film boundary neighboring portion") of the liquid film of the processing liquid.

When the periphery of a liquid film boundary neighboring portion is in an atmosphere of a low surface tension liquid containing gas, a concentration difference in the low surface tension liquid, that is, a surface tension difference, occurs between a portion near the liquid film boundary of a thin film (hereinafter referred to as "thin liquid film boundary neighboring portion") of the processing liquid and a bulk portion of the liquid film of the processing liquid. Therefore, the liquid film boundary neighboring portion behaves so as to bulge up as a result of the contraction action of the processing liquid due to the Marangoni effect. As a result, the angle (hereinafter referred to as "liquid level angle at the liquid film boundary") defined by the liquid level of the processing liquid and the substrate upper surface at the liquid film boundary increases.

At the time of forming a liquid film removed region, when the liquid film removed region is relatively small, the first discharge step is executed. Subsequently, at predetermined timing when the liquid film removed region has expanded to some degree, the execution of the first discharge step is stopped, and the execution of the second discharge step is started. That is, at this timing, the discharge port from which the low surface tension liquid containing gas is to be discharged is switched from the first discharge port to the second discharge port. This makes it possible to move the supply position of the low surface tension liquid containing gas on the upper surface of the substrate following the movement of the liquid film boundary accompanying the expansion of the liquid film removed region. This makes it possible to keep the periphery of the liquid film boundary neighboring portion in the atmosphere of the low surface tension liquid containing gas over a period from the formation of a liquid film removed region to the expansion of the liquid film removed region over the entire surface of the substrate. Thereby, this makes it possible to keep a large liquid level angle at the liquid film boundary neighboring portion over the period. It is therefore possible to remove the processing liquid from the upper surface of the substrate while suppressing or preventing pattern collapse.

According to an embodiment of the present invention, the discharging direction of a gas discharged from the first discharge port includes a vertical downward direction, and the discharging direction of a gas discharged from the second discharge port includes an outward obliquely downward direction.

According to this method, in the second discharge step, the low surface tension liquid containing gas is discharged from the second discharge port in an outward obliquely downward direction. Because the specific gravity of the low surface tension liquid containing gas is larger than that of air, the low surface tension liquid containing gas discharged from the second discharge port moves near the upper surface of the substrate outward along the upper surface and collides with the liquid film boundary. This can efficiently supply the low surface tension liquid containing gas to the liquid film boundary. Further, because the moving direction of the low surface tension liquid containing gas coincides with the moving direction of the liquid film boundary. Therefore, it is possible to keep supplying the low surface tension liquid containing gas to the liquid film boundary regardless of the moving situation of the liquid film boundary.

The low surface tension liquid containing gas may have a temperature higher than room temperature.

According to this method, the low surface tension liquid containing gas discharged from the first discharge port and/or the second discharge port has a temperature higher than room temperature. In this case, when the liquid temperature of the liquid film of the processing liquid formed on the upper surface of the substrate is room temperature, the low surface tension liquid containing gas supplied onto the upper surface of the substrate has a higher temperature than the liquid film of the processing liquid. Therefore, the dew condensation amount of low surface tension liquid containing gas on the substrate upper surface increases in the first discharge step and the second discharge step. Accordingly, the thin film of the processing liquid becomes thicker. This increases the concentration difference in the low surface tension liquid between the liquid film boundary neighboring portion and the bulk portion of the liquid film of the processing liquid, that is, the surface tension difference between the liquid film boundary neighboring portion and the bulk portion of the liquid film of the processing liquid. This increases the Marangoni effect acting on the liquid film of the processing liquid, resulting in a further increase in the liquid level angle at the liquid film boundary. It is therefore possible to keep a larger liquid level angle at the liquid film boundary over a period from the formation of the liquid film removed region and the expansion of the liquid film removed region over the entire upper surface of the substrate.

The second discharge step may include a step of discharging, from the first discharge port, an inert gas containing no steam of the low surface tension liquid and having a smaller specific gravity than the low surface tension liquid.

According to this method, the inert gas is discharged toward the first region on the substrate upper surface in the second discharge step. Supplying the inert gas onto a central portion of the upper surface of the substrate will replace the atmosphere on the central portion of the upper surface of the substrate with the gas, thereby promoting the evaporation of the low surface tension liquid contained in the thin film of the processing liquid. This makes it possible to promote the removal (drying) of the processing liquid on the central portion of the upper surface of the substrate.

The inert gas supplied to the first region pushes and expands the low surface tension liquid containing gas, discharged toward the second region, outward in the radial direction. This makes it possible to press the low surface tension liquid containing gas against the liquid film boundary, thereby keeping the periphery of the liquid film boundary neighboring portion in an atmosphere of the low surface tension liquid containing gas.

When isopropyl alcohol (IPA), hydro fluoro ether (HFE), or the like is to be used as the above low surface tension liquid, nitrogen gas, helium gas, argon gas, or the like can be adopted as the above inert gas.

The low surface tension liquid containing gas may have a temperature higher than room temperature. Further, the second discharge step includes a step of discharging, from the first discharge port, an inert gas containing no steam of the low surface tension liquid and having a smaller specific gravity than the low surface tension liquid.

When the low surface tension liquid containing gas has a temperature higher than room temperature, the surface tension liquid containing gas preferably has a high temperature to enhance the Marangoni effect acting on a liquid film of the processing liquid. In this case, however, with an increase in the dew condensation amount of the low surface tension liquid containing gas on the upper surface of the substrate, the thickness of the liquid film boundary neighboring portion of the thin film increases. When the thickness of the liquid film boundary neighboring portion of the thin film exceeds the height of the pattern, pattern collapse may occur accompanying the movement of the liquid film boundary (expansion of the liquid film removed region).

In the second discharge step, however, discharging an inert gas from the first discharge port pushes and spreads the liquid film removed region, thus promoting the movement of the liquid film boundary. This makes it possible to move the liquid film boundary to the edge of the substrate before the thickness of the liquid film boundary neighboring portion of the thin film increases. Therefore, it is possible to remove (dry) the processing liquid from the entire upper surface of the substrate before pattern collapse.

The first discharge step may include a step of discharging, from the second discharge port, an inert gas containing no steam of the low surface tension liquid and having a smaller specific gravity than the low surface tension liquid.

According to this method, an inert gas is discharged from the second discharge port in the first discharge step. In the first discharge step, because of the presence of a small-diameter liquid film removed region in the region including the rotating center of the substrate, the bulk portion of the liquid film of the processing liquid is located in the second region. Therefore, discharging an inert gas from the second discharge port can cover the upper surface of the bulk portion of the liquid film of the processing liquid with the inert gas. This can suppress or prevent an atmosphere of the low surface tension liquid containing gas from being supplied to the bulk portion of the liquid film of the processing liquid in the first discharge step.

Assume that the atmosphere of the low surface tension liquid containing gas covers not only the liquid film boundary neighboring portion but also the periphery of the upper surface of the bulk portion of the liquid film. In this case, the Marangoni effect decreases, and the liquid level angle at the boundary portion may decrease. In contrast to this, according to the above-described method, because a low surface tension liquid is supplied to only a liquid film boundary neighboring portion, the Marangoni effect can be enhanced. This makes it possible to keep a large liquid level angle at the boundary portion.

In the first discharge step, due to the specific gravity difference between a low surface tension liquid and an inert gas, the low surface tension liquid containing gas flows at a lower position near the substrate upper surface, and the inert gas flows at a higher position away from the substrate upper surface. This makes it possible to move the low surface tension liquid containing gas discharged from the first discharge port near the upper surface of the substrate outward along the upper surface, thereby making the low surface tension liquid containing gas collide with the liquid film boundary. It is therefore possible to keep sufficiently supplying the low surface tension liquid containing gas to the liquid film boundary even after the movement of the liquid film boundary outside the first region.

When isopropyl alcohol (IPA), hydro fluoro ether (HFE), or the like is to be used as the above low surface tension liquid, nitrogen gas, helium gas, argon gas, or the like can be adopted as the above inert gas.

The above processing liquid may contain water, and the low surface tension liquid may contain an organic solvent.

The above and other objects, features, and effects of the present invention will become more apparent from the following detailed description of the preferred embodiments with reference to the attached drawings.

BRIEF DESCRIPTION OF THE DRAWINGS

FIG. 6B is a timing chart for explaining a rinse step and a drying step in an example of the above substrate processing.

FIG. 7 is an illustrative sectional view for explaining a paddle rinse step.

FIG. 8 is an illustrative sectional view for explaining a step (paddle rinse step) executed following the step in FIG. 7.

FIG. 9 is an illustrative sectional view for explaining a step (first discharge step) executed following the step in FIG. 8.

FIG. 10 is an illustrative sectional view for explaining a step (first discharge step) executed following the step in FIG. 9.

FIG. 11 is an illustrative sectional view for explaining a step (second discharge step) executed following the step in FIG. 10.

FIG. 12 is an illustrative sectional view for explaining a step (second discharge step) executed following the step in FIG. 11.

FIG. 13 is an illustrative sectional view for explaining a spin-drying step executed following the step in FIG. 12.

DETAILED DESCRIPTION OF PREFERRED EMBODIMENTS

Figure 1:
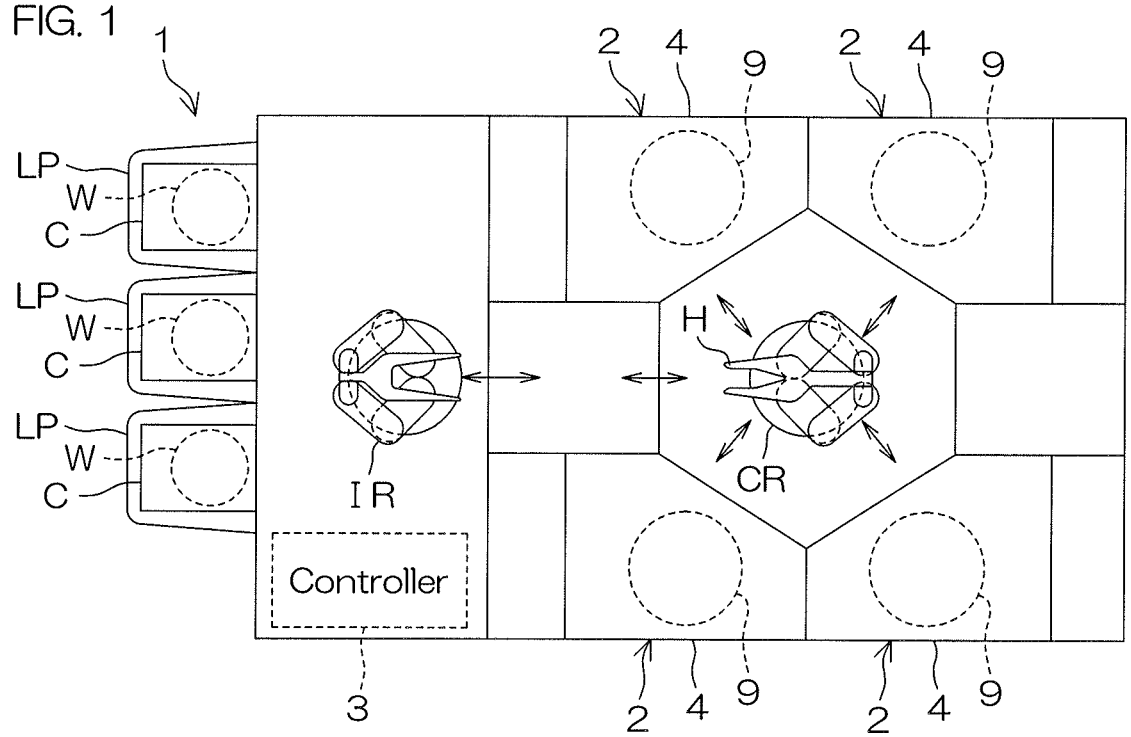
FIG. 1 is an illustrative plan view for explaining the internal layout of a substrate processing apparatus that executes a substrate processing method according to the first preferred embodiment of the present invention.

FIG. 1 is an illustrative plan view for explaining the internal layout of a substrate processing apparatus 1 that executes a substrate processing method according to the first preferred embodiment of the present invention. The substrate processing apparatus 1 is a single substrate processing type apparatus that processes substrates W such as silicon wafers one by one. In this preferred embodiment, the substrate W is a disk-shaped substrate. The substrate processing apparatus 1 includes a plurality of processing units 2 that process the substrates W with a processing liquid, load ports LP on which carriers C that accommodate the plurality of substrates W to be processed by the processing units 2 are mounted, transfer robots IR and CR that transfer the substrates W between the load ports LP and the processing units 2, and a controller 3 that controls the substrate processing apparatus 1. The transfer robot IR transfers the substrates W between the carriers C and the transfer robot CR. The transfer robot CR transfers the substrates W between the transfer robot IR and the processing units 2. For example, the plurality of processing units 2 have the same arrangement.

Figure 2:
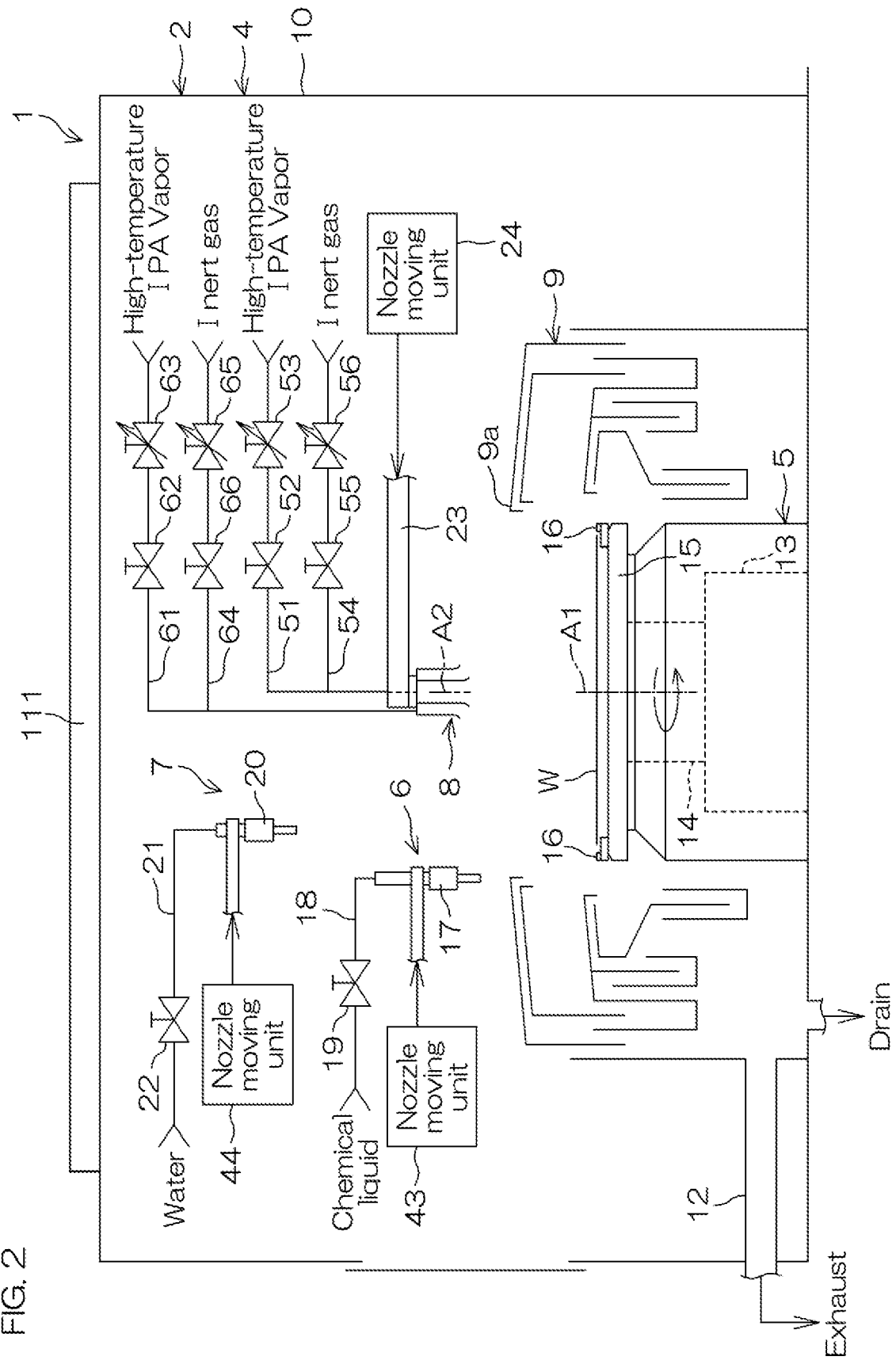
FIG. 2 is an illustrative sectional view for explaining an example of the arrangement of a processing unit provided for the substrate processing apparatus.

FIG. 2 is an illustrative sectional view for explaining an example of the arrangement of the processing unit 2.

The processing unit 2 includes a box-shaped chamber 4, a spin chuck 5 that holds one substrate W in the chamber 4 in a horizontal posture and rotates the substrate W around a vertical rotating axis A1 passing through the center of the substrate W, a chemical liquid supply unit 6 that supplies a chemical liquid onto the upper surface of the substrate W held by the spin chuck 5, a water supply unit 7 that supplies water (processing liquid) as a rinse liquid onto the upper surface of the substrate W held by the spin chuck 5, a gas discharge nozzle 8 that supplies at least one of steam (low surface tension liquid containing gas: IPA Vapor) of isopropyl alcohol (IPA) as an example of an organic solvent that is a low surface tension liquid having a larger specific gravity than air and an inert gas to above the substrate W held by the spin chuck 5, and a cylindrical cup 9 surrounding the circumference of the spin chuck 5.

The chamber 4 includes a box-shaped partition wall 10 that accommodates the spin chuck 5 and the nozzle, a fan filter unit (FFU) 111 as an air blowing unit that sends clean air (air filtered by a filter) from an upper portion of the partition wall 10 into the partition wall 10, and an exhaust duct 12 that exhausts a gas in the chamber 4 from a lower portion of the partition wall 10. The FFU 111 is disposed above the partition wall 10 and is attached to the ceiling of the partition wall 10. The FFU 111 sends clean air downward from the ceiling of the partition wall 10 into the chamber 4. The exhaust duct 12 is connected to the bottom portion of the cup 9 and delivers a gas in the chamber 4 toward an exhaust treatment facility provided in a factory in which the substrate processing apparatus 1 is installed. A downflow (descending flow) flows downward in the chamber 4 is formed by the FFU 111 and the exhaust duct 12. The substrate W is processed while a downflow is formed in the chamber 4.

As the spin chuck 5, a clamping type chuck is adopted, which horizontally holds the substrate W while clamping the substrate W in a horizontal direction. More specifically, the spin chuck 5 includes a spin motor 13, a spin shaft 14 integrated with the drive shaft of the spin motor 13, and a disk-shaped spin base 15 substantially horizontally attached to the upper end of the spin shaft 14.

A plurality of (three or more, for example, six) clamping members 16 are arranged on the upper surface of the spin base 15 at its peripheral edge portion. The plurality of clamping members 16 are arranged on the upper surface peripheral edge portion of the spin base 15 at proper intervals on a circumference corresponding to the outer circumferential shape of the substrate W.

The spin chuck 5 is not limited to a clamping type chuck. For example, a vacuum suction type chuck (vacuum chuck) may be used, which horizontally holds the substrate W by vacuum-sucking the rear surface of the substrate W and also rotates around a vertical rotating axis in this state to rotate the substrate W held by the spin chuck 5.

The chemical liquid supply unit 6 includes a chemical liquid nozzle 17, a chemical liquid piping 18 connected to the chemical liquid nozzle 17, a chemical liquid valve 19 interposed in the chemical liquid piping 18, and a first nozzle moving unit 43 that moves the chemical liquid nozzle 17. The chemical liquid nozzle 17 is, for example, a straight nozzle that discharges a liquid in a continuous flow state. A chemical liquid is supplied from a chemical liquid source to the chemical liquid piping 18.

When the chemical liquid valve 19 is opened, the chemical liquid supplied from the chemical liquid piping 18 to the chemical liquid nozzle 17 is discharged downward from the chemical liquid nozzle 17. When the chemical liquid valve 19 is closed, the chemical liquid nozzle 17 stops discharging the chemical liquid. The first nozzle moving unit 43 moves the chemical liquid nozzle 17 between a processing position at which the chemical liquid discharged from the chemical liquid nozzle 17 is supplied onto the upper surface of the substrate W and a retraction position at which the chemical liquid nozzle 17 is retracted to a side of the spin chuck 5 in plan view.

Specific examples of chemical liquids are etchants and cleaning liquids. More specifically, chemical liquids may be fluorine, ammonia hydrogen peroxide mixture (SC1), hydrochloric acid hydrogen peroxide mixture (SC2), ammonium fluoride, and buffered fluorine (mixture of hydrofluoric acid and ammonium fluoride).

The water supply unit 7 includes a water nozzle 20, a water piping 21 connected to the water nozzle 20, a water valve 22 interposed in the water piping 21, and a second nozzle moving unit 44 that moves the water nozzle 20. The water nozzle 20 is, for example, a straight nozzle that discharges a liquid in a continuous flow state. Water of room temperature (about 23° C.) is supplied from a water source to the water piping 21.

When the water valve 22 is opened, the water supplied from the water piping 21 to the water nozzle 20 is discharged downward from the water nozzle 20. When the water valve 22 is closed, the water nozzle 20 stops discharging the water. The second nozzle moving unit 44 moves the water nozzle 20 between a processing position at which the chemical liquid discharged from the water nozzle 20 is supplied onto the upper surface of the substrate W and a retraction position at which the water nozzle 20 is retracted to a side of the spin chuck 5 in plan view.

A specific example of water includes, but is not limited to, for example, deionized water (DIW), and water may be one of the following: carbonated water, field ionized water, hydrogen water, ozone water, and hydrochloric acid water with a dilute concentration (for example, about 10 ppm to 100 ppm).

Note that the chemical liquid nozzle 17 and the water nozzle 20 need not be provided so as to be scannable. For example, a so-called fixed nozzle form may be adopted, in which each nozzle is fixed above the spin chuck 5 so as to land a processing liquid (chemical liquid or water) at a predetermined position on the upper surface of the substrate W.

The gas discharge nozzle 8 is attached to the distal end portion of a nozzle arm 23. A third nozzle moving unit 24 is coupled to the nozzle arm 23. The third nozzle moving unit 24 vertically moves or swings the nozzle arm 23 and moves the gas discharge nozzle 8. The third nozzle moving unit 24 is constituted by, for example, a servo motor, a ball screw mechanism, and the like.

Figure 3:
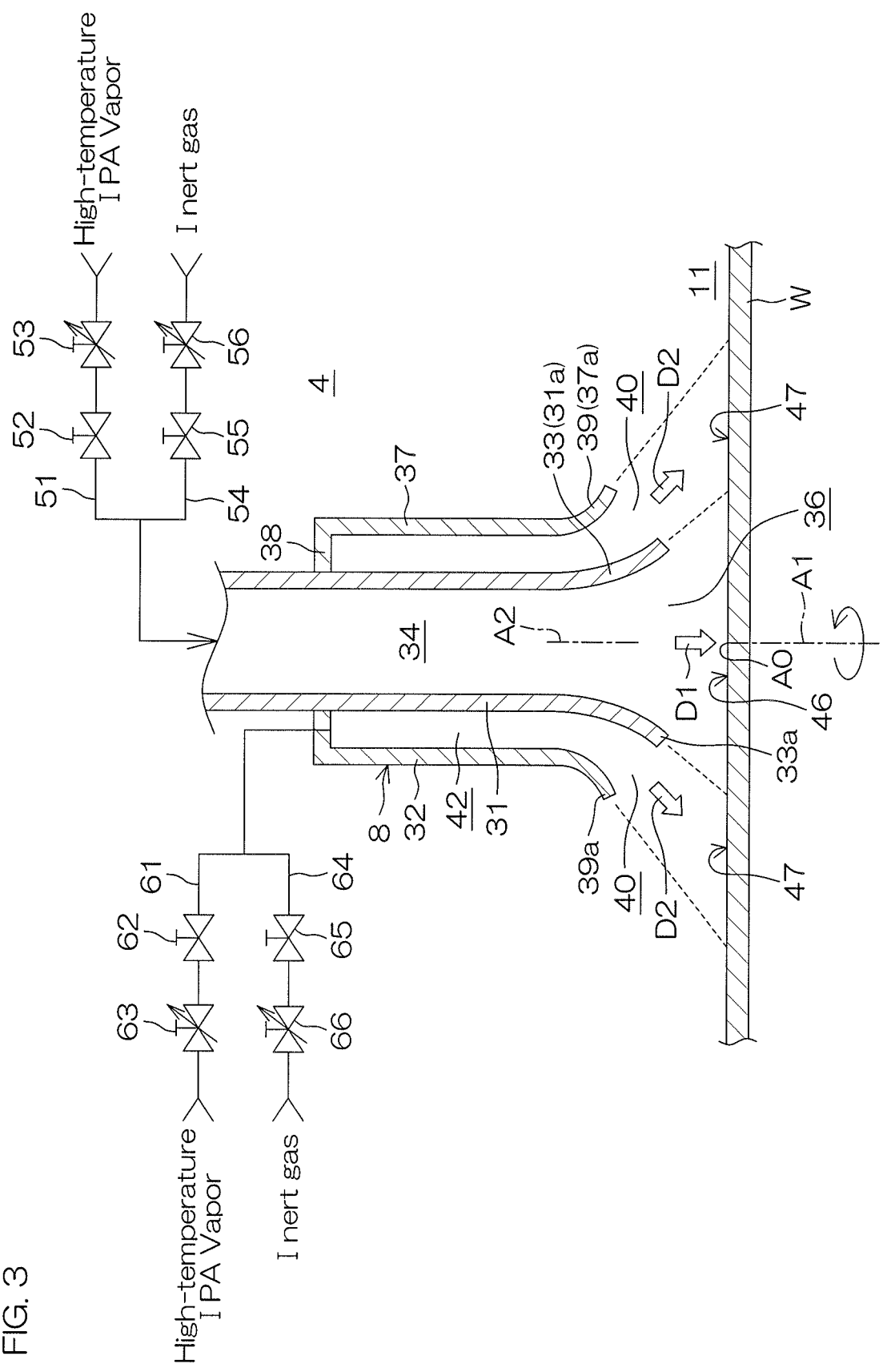
FIG. 3 is a schematic longitudinal sectional view for explaining an example of the arrangement of a gas discharge nozzle provided for the substrate processing apparatus.

FIG. 3 is a schematic longitudinal sectional view for explaining an example of the arrangement of the gas discharge nozzle 8. FIG. 3 shows a state in which the gas discharge nozzle 8 is disposed near the upper surface of the substrate W.

The gas discharge nozzle 8 is a double-cylinder gas discharge nozzle having a first cylinder (inner cylinder) 31 and a second cylinder (outer cylinder) 32 that is fitted on the first cylinder 31 and encloses the first cylinder 31. The central axes of the first and second cylinders 31 and 32 are arranged on a common central axis A2 as a vertical axis. The first cylinder 31 has a cylindrical shape except for a lower end portion 31a. The first and second cylinders 31 and 32 each are formed by using a resin material such as vinyl chloride, polychlorotrifuruoroethylene (PCTFE), polyvinylidenedifluoride (PVDF), polytetrafluoroethylene (PTFE), or perfluoro-alkylvinyl-ether-tetrafluoro-ethlene-copolymer (PFA).

The lower end portion 31a of the first cylinder 31 includes a first trumpet-shaped portion 33 spreading out downward. A lower end portion 33a of the first trumpet-shaped portion 33 forms the lower end of the gas discharge nozzle 8. The internal space of the first cylinder 31 forms a first gas channel 34 through which the organic solvent steam supplied from a first organic solvent steam piping 51 or the inert gas supplied from a second inert gas piping 64 is circulated. A round opening is formed in the lower end of the first gas channel 34. This opening forms a first discharge port 36. The lower end portion 31a of the first cylinder 31 is also formed into a trumpet shape. With this structure, the gas discharged from a central part of the first discharge port 36 is discharged downward in the vertical direction, and the gas discharged from a peripheral edge portion of the first discharge port 36 is discharged outward obliquely downward. That is, the first discharge port 36 discharges a gas (organic solvent steam or inert gas) circulating through the first gas channel 34 substantially downward as a whole.

The second cylinder 32 includes a cylindrical portion 37 and a closed portion 38 that closes the upper end portion of the cylindrical portion 37. A seal member (not shown) airtightly seals between the outer circumference of the first cylinder 31 and the inner circumference of the closed portion 38. A lower end portion 37a of the cylindrical portion 37 includes a second trumpet-shaped portion 39 spreading out downward. The second trumpet-shaped portion 39 has a higher bending rate than the first trumpet-shaped portion 33. A lower end portion 39a of the second trumpet-shaped portion 39 has a larger inclination angle with respect to the vertical direction than the lower end portion 33a of the first trumpet-shaped portion 33. The lower end portion 39a of the second trumpet-shaped portion 39 is located higher than the lower end portion 33a of the first trumpet-shaped portion 33. The space between the first cylinder 31 and the cylindrical portion 37 of the second cylinder 32 defines a second gas channel 42 through which the organic solvent steam supplied from a second organic solvent steam piping 61 or the inert gas supplied from the second inert gas piping 64 is circulated.

In the lower end portion of the second gas channel 42, an annular second discharge port 40 facing outward obliquely downward is defined by the lower end portion 33a of the first trumpet-shaped portion 33 and the lower end portion 39a of the second trumpet-shaped portion 39. The second discharge port 40 discharges the gas (organic solvent steam or inert gas) circulating through the second gas channel 42 annularly and outward obliquely downward. Because the lower end portion 39a of the second trumpet-shaped portion 39 is larger in inclination angle with respect to the vertical direction than the lower end portion 33a of the first trumpet-shaped portion 33, the inclination angle of a discharge direction D2 of a gas from the second discharge port 40 with respect to the vertical direction is larger than the inclination angle of a discharge direction D1 of a gas from the first discharge port 36 with respect to the vertical direction. In other words, the degree of inclination of the discharge direction D2 of a gas from the second discharge port 40 with respect to the vertical direction is larger than that of the discharge direction D1 of a gas from the first discharge port 36 with respect to the vertical direction.

The first organic solvent steam piping 51 and a first inert gas piping 54 are connected to the first gas channel 34 of the gas discharge nozzle 8. An organic solvent steam (for example, IPA steam) having a high temperature (a temperature higher than room temperature, for example, about 80° C.) from the organic solvent steam source is supplied to the first organic solvent steam piping 51. An inert gas (for example, at least one of nitrogen gas, argon gas, and helium gas) from the inert gas source is supplied to the first inert gas piping 54. The inert gas supplied to the first inert gas piping 54 has a smaller specific gravity than the organic solvent steam supplied to the gas discharge nozzle 8. A first organic solvent steam valve 52 and a first flow rate adjusting valve 53 are interposed in the first organic solvent steam piping 51. The first organic solvent steam valve 52 is used to open and close the first organic solvent steam piping 51. The first flow rate adjusting valve 53 is used to adjust the flow rate of organic solvent steam discharged from the first discharge port 36 by adjusting the degree of opening of the first organic solvent steam piping 51. Although not shown, the first flow rate adjusting valve 53 includes a valve body internally provided with a valve seat, a valving element that opens and closes the valve seat, and an actuator that moves the valving element between the opening position and the closing position. The same applies to the remaining flow rate adjusting valves. A first inert gas valve 55 and a second flow rate adjusting valve 56 are interposed in the first inert gas piping 54. The first inert gas valve 55 is used to open and close the first inert gas piping 54. The second flow rate adjusting valve 56 is used to adjust the flow rate of inert gas discharged from the first discharge port 36 by adjusting the degree of opening of the first inert gas piping 54. Opening the first organic solvent steam valve 52 while closing the first inert gas valve 55 will supply high-temperature organic solvent steam from the first organic solvent steam piping 51 to the first gas channel 34. The high-temperature organic solvent steam flowing through the first gas channel 34 and reaching the lower end of the first gas channel 34 is discharged from the first discharge port 36. Further, opening the first inert gas valve 55 while closing the first organic solvent steam valve 52 will supply an inert gas from the first inert gas piping 54 to the first gas channel 34. The inert gas flowing through the first gas channel 34 and reaching the lower end of the first gas channel 34 is discharged from the first discharge port 36.

The second organic solvent steam piping 61 and the second inert gas piping 64 are connected to the second gas channel 42 of the gas discharge nozzle 8. An organic solvent steam (for example, IPA steam) having a high temperature (a temperature higher than room temperature, for example, about 80° C.) from the organic solvent steam source is supplied to the second organic solvent steam piping 61. An inert gas (for example, at least one of nitrogen gas, argon gas, and helium gas) from the inert gas source is supplied to the second inert gas piping 64. The organic solvent steam supplied to the second organic solvent steam piping 61 has a smaller specific gravity than the organic solvent steam supplied to the gas discharge nozzle 8. A second organic solvent steam valve 62 and a third flow rate adjusting valve 63 are interposed in the second organic solvent steam piping 61. The second organic solvent steam valve 62 is used to open and close the second organic solvent steam piping 61. The third flow rate adjusting valve 63 is used to adjust the flow rate of organic solvent steam discharged from the second discharge port 40 by adjusting the degree of opening of the second organic solvent steam piping 61. A second inert gas valve 65 and a fourth flow rate adjusting valve 66 are interposed in the second inert gas piping 64. The second inert gas valve 65 is used to open and close the second inert gas piping 64. The fourth flow rate adjusting valve 66 is used to adjust the flow rate of inert gas discharged from the second discharge port 40 by adjusting the degree of opening of the second inert gas piping 64. Opening the second organic solvent steam valve 62 while closing the first inert gas valve 55 will supply high-temperature organic solvent steam from the first organic solvent steam piping 51 to the second gas channel 42. The high-temperature organic solvent steam flowing through the first gas channel 34 and reaching the lower end of the second gas channel 42 is discharged from the second discharge port 40. Further, opening the second inert gas valve 65 while closing the second organic solvent steam valve 62 will supply an inert gas from the second inert gas piping 64 to the second gas channel 42. The inert gas flowing through the second gas channel 42 and reaching the lower end of the second gas channel 42 is discharged from the second discharge port 40.

When the substrate processing apparatus 1 processes the substrate W, the substrate W rotates around the rotating axis (predetermined vertical axis) A1 of the substrate W accompanying the rotation of the spin chuck 5, as shown in FIG. 3. In this state, the gas discharge nozzle 8 is disposed at a lower position at which the lower end portion 33a of the first trumpet-shaped portion 33 faces the upper surface of the substrate W through a predetermined interval (for example, about 10 mm). At this time, the central axis A2 of the gas discharge nozzle 8 substantially coincides with the rotating axis A1.

In this state, when the first organic solvent steam valve 52 and the first inert gas valve 55 are selectively opened, the gas (organic solvent steam or inert gas) discharged from the first discharge port 36 is sprayed on a substantially circular first region 46 centered on a rotating center A0 (on the rotating axis A1) of the upper surface of the substrate W. In this state, when the second organic solvent steam valve 62 and the second inert gas valve 65 are selectively opened, the gas (organic solvent steam or inert gas) discharged from the second discharge port 40 is sprayed on a substantially annular second region 47 surrounding the outside of the first region 46. In the substrate processing apparatus 1 that processes the 450-mm substrate W, the substantially circular first region 46 has a diameter of, for example, about 50 mm, and the substantially annular second region 47 has an inner diameter of, for example, about 50 mm and an outer diameter, for example, about 150 mm.

As shown in FIG. 2, the cup 9 is disposed outside (in a direction away from the rotating axis A1) the substrate W held by the spin chuck 5. The cup 9 surrounds the spin base 15. When a processing liquid is supplied to the substrate W while the spin chuck 5 rotates the substrate W, the processing liquid supplied to the substrate W is scattered around the substrate W. When the processing liquid is supplied to the substrate W, an upper end portion 9a of the cup 9 open upward is disposed higher than the spin base 15. Therefore, a processing liquid such as a chemical liquid or water discharged around the substrate W is received by the cup 9. The processing liquid received by the cup 9 is sent to a recovery unit or waste disposal unit (not shown).

Figure 4:
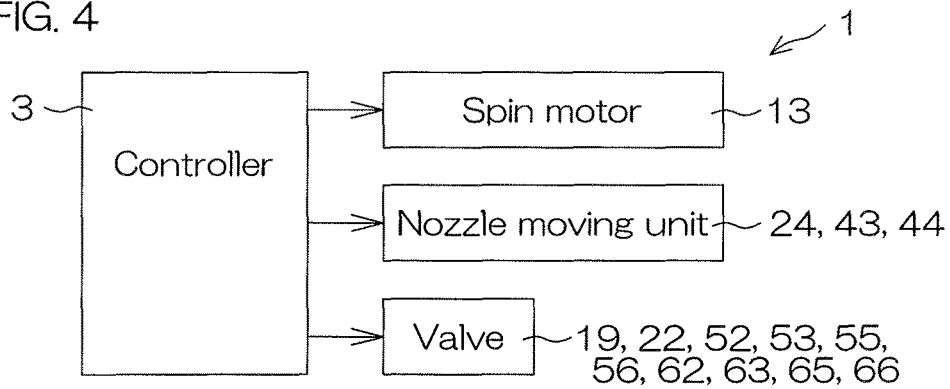
FIG. 4 is a block diagram for explaining the electrical arrangement of the main part of the substrate processing apparatus.

FIG. 4 is a block diagram for explaining the electrical arrangement of the main part of the substrate processing apparatus 1.

The controller 3 is formed by using, for example, a microcomputer. The controller 3 includes an arithmetic unit such as a CPU, a fixed memory device, a storage unit such as a hard disk drive, and an input/output unit. The storage unit stores programs executed by the arithmetic unit.

The controller 3 controls the operations of the spin motor 13, the first to third nozzle moving units 43, 44, and 24, and the like in accordance with predetermined programs. The controller 3 further controls the opening/closing operations of the chemical liquid valve 19, the water valve 22, the first organic solvent steam valve 52, the first inert gas valve 55, the second organic solvent steam valve 62, the second inert gas valve 65, the first flow rate adjusting valve 53, the second flow rate adjusting valve 56, the third flow rate adjusting valve 63, the fourth flow rate adjusting valve 66, and the like.

Figure 5:
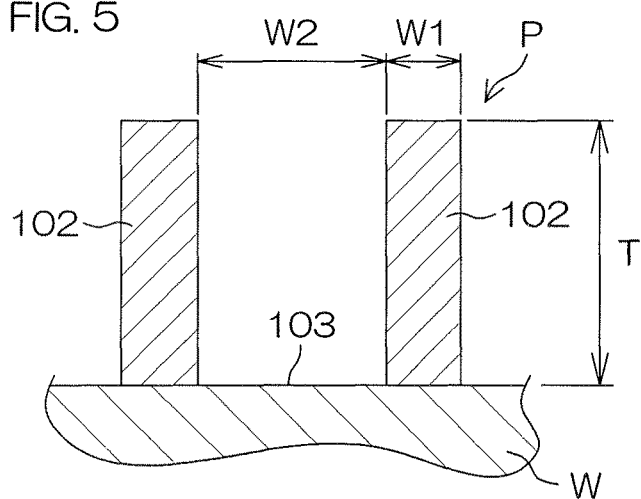
FIG. 5 is an enlarged sectional view of the front surface of a substrate Was a processing target of the processing unit.

FIG. 5 is an enlarged sectional view of the front surface of the substrate W as a processing target of the processing unit 2. The substrate W as a processing target is, for example, a silicon wafer. Patterns P are formed on the front surface (upper surface 103) as the pattern formation surface of the substrate W. The patterns P are, for example, fine patterns. As shown in FIG. 5, the patterns P may be structures 102, each having a convex shape (columnar shape), arranged in a matrix. In this case, a line width W1 of each structure 102 is, for example, about 10 nm to 45 nm and a gap W2 between the patterns P is, for example, 10 nm to several μm. A film thickness T of the pattern P is, for example, about 1 μm. Further, the aspect ratio (the ratio of the film thickness T to the line width W1) of the pattern P may be, for example, 5 to 500 (typically, about 5 to 50).

The patterns P may be linear patterns formed by fine trenches and repeatedly arranged. Further, the patterns P may be formed by providing a plurality of fine holes (voids or pores) in a thin film.

Each pattern P includes, for example, an insulating film. Further, the pattern P may include a conductive film. More specifically, the pattern P is formed from a multilayer film obtained by stacking a plurality of films, and may also include an insulating film and a conductive film. The pattern P may be a pattern formed from a single-layer film. The insulating film may be a silicon oxide film ($SiO_2$ film) or a silicon nitride film (SiN film). The conductive film may be an amorphous silicon film doped with an impurity for lower resistance or may be a metal film (for example, a metal wiring film).

Each pattern P may be a hydrophilic film. As a hydrophilic film, for example, a TEOS film (a type of silicon oxide film) can be provided.

Figure 6A:
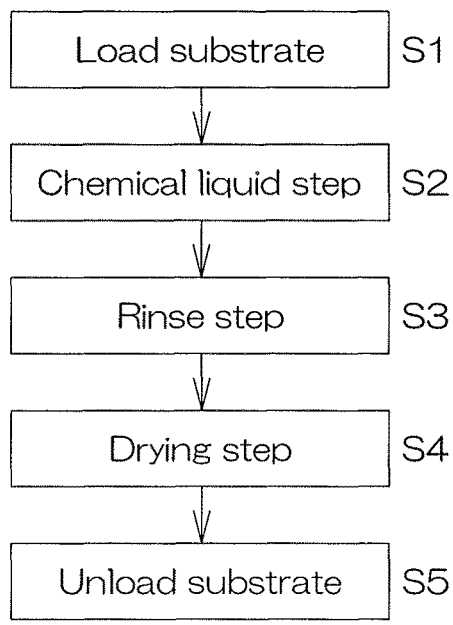
FIG. 6A is a flowchart for explaining an example of substrate processing by the substrate processing apparatus.
Figure 14:
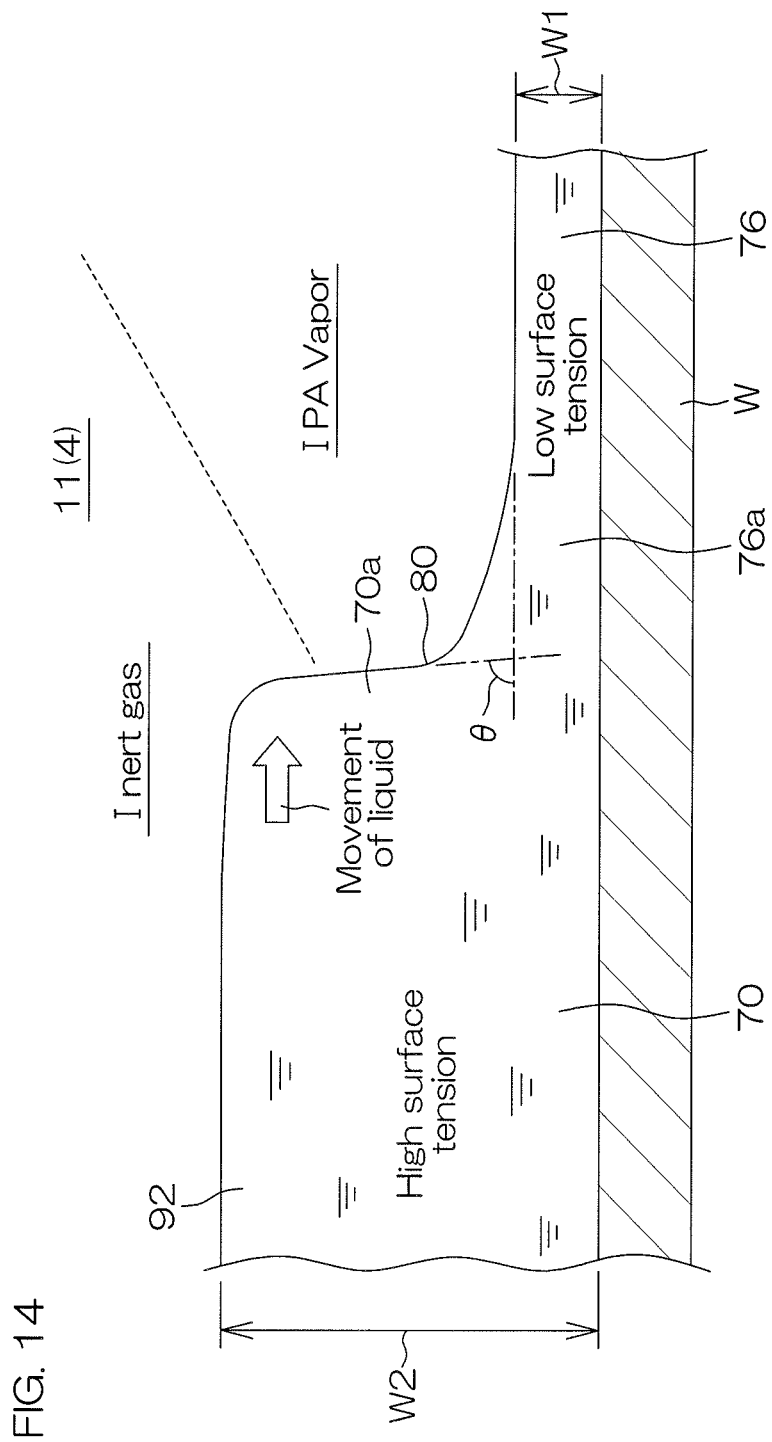
FIG. 14 is a view for explaining the Marangoni effect generated in a liquid film boundary neighboring portion of water.

FIG. 6A is a flowchart for explaining an example of substrate processing by the substrate processing apparatus 1. FIG. 6B is a timing chart for explaining a rise step (S3) and a drying step (S4), which are executed by the substrate processing apparatus 1. FIGS. 7 to 13 are illustrative views for explaining the respective steps from paddle rinse step T11 and spin-drying step T3. FIG. 14 is a view for explaining the Marangoni effect generated in a liquid film boundary neighboring portion 70a of water.

Substrate processing will be explained with reference to FIGS. 1 to 13. FIG. 14 will be referred to as needed.

The unprocessed substrate W (a circular substrate having a diameter of, for example, 450 mm) is loaded from the carrier C to the processing unit 2 by the transfer robots IR and CR and is loaded into the chamber 4. The substrate W is then transferred to the spin chuck 5 while the front surface (pattern formation surface) is facing upward. The substrate W is held by the spin chuck 5 (S1: substrate loading step (substrate holding step)). Before the substrate W is loaded, the chemical liquid nozzle 17, the water nozzle 20, and the gas discharge nozzle 8 are retracted to home positions set on a side of the spin chuck 5.

After the transfer robot CR is retracted outside the processing unit 2, the controller 3 executes a chemical liquid step (step S2). More specifically, the controller 3 controls the spin motor 13 to rotate the spin base 15 at a predetermined liquid processing speed (for example, about 800 rpm). Further, the controller 3 controls the first nozzle moving unit 43 to move the chemical liquid nozzle 17 from the retracted position to the processing position. Subsequently, the controller 3 opens the chemical liquid valve 19 to discharge a chemical liquid from the chemical liquid nozzle 17 toward the upper surface of the substrate W in a rotated state. The chemical liquid discharged from the chemical liquid nozzle 17 is supplied onto the upper surface of the substrate W and flows outward along the upper surface of the substrate W due to centrifugal force. Further, the controller 3 moves the supply position of the chemical liquid with respect to the upper surface of the substrate W between a central portion and a peripheral edge portion while the substrate W is rotated. With this operation, the supply position of the chemical liquid passes through the entire upper surface of the substrate W, the entire upper surface of the substrate W is scanned, and the entire upper surface of the substrate W is uniformly processed. When a predetermined period has elapsed since the start of discharging of a chemical liquid, the controller 3 closes the chemical liquid valve 19 to stop discharging the chemical liquid from the chemical liquid nozzle 17. The controller 3 then controls the first nozzle moving unit 43 to retract the chemical liquid nozzle 17 from above the spin chuck 5.

The controller 3 then executes a rinse step (step S3). The rinse step is a step of removing the chemical liquid from on the substrate W by replacing the chemical liquid on the substrate W with water. More specifically, the controller 3 controls the second nozzle moving unit 44 to move the water nozzle 20 from the retracted position to the processing position. The controller 3 opens the water valve 22. This supplies water from the water nozzle 20 toward the upper surface of the substrate W in a rotating state. The supplied water is distributed over the entire surface of the substrate W by centrifugal force. This water washes off the chemical liquid adhering onto the substrate W.

When a predetermined period has elapsed since the start of supply of water, the controller 3 controls the spin motor 13 to stepwisely reduce the rotation speed of the substrate W from a liquid processing speed to a paddle speed (a low rotation speed of 0 rpm or about 40 rpm or less, for example, about 10 rpm in the case shown in FIG. 6B) while the entire upper surface of the substrate W is covered with water. Subsequently, the controller 3 maintains the rotation speed of the substrate W at the paddle speed (paddle rinse step T11 (liquid film forming step)). As shown in FIG. 7, this supports a liquid film (liquid film of processing liquid) 70 covering the entire upper surface of the substrate W in a paddle state on the upper surface of the substrate W. In this state, the centrifugal force acting on the liquid film 70 of water on the upper surface of the substrate W is smaller than or almost equal to the surface tension acting between the water and the upper surface of the substrate W. Decelerating the substrate W will reduce the centrifugal force acting on the water on the substrate W and hence reduce the amount of water exhausted from on the substrate W. Further, in paddle rinse step T11, water may be kept supplied to the substrate W even after the formation of the liquid film 70 of water in a paddle state.

When a predetermined period has elapsed since deceleration of the substrate W to the paddle speed, the controller 3 controls the third nozzle moving unit 24 to pull out the gas discharge nozzle 8 from the retracted position to above the central portion of the substrate W. In this state, the central axis A2 of the gas discharge nozzle 8 substantially coincides with the rotating axis A1.

When a predetermined period has elapsed since the deceleration of the substrate W to the paddle speed, the controller 3 closes the water valve 22 to stop discharging water from the water nozzle 20. Subsequently, the controller 3 controls the second nozzle moving unit 44 to return the water nozzle 20 to the retracted position.

Subsequently, the controller 3 controls the third nozzle moving unit 24 to lower the gas discharge nozzle 8 to a lower position (discharge port disposition step). When a predetermined period has elapsed since the discharge of the water nozzle 20, the controller 3 controls the spin motor 13 to accelerate the rotation of the substrate W. With this operation, paddle rinse step T11 is finished (rinse step (S3) is finished).

The controller 3 then executes a drying step (step S4). In the drying step (S4), the controller 3 controls the spin motor 13 to increase the rotation speed of the substrate W to a predetermined first rotation speed (for example, about 50 rpm) (rotation step). Upon reception of the centrifugal force generated by the rotation (about 50 rpm) of the substrate W, the water on the central portion of the substrate W spreads outward by being pushed. As a result, the liquid film 70 of water on the central portion of the substrate W is partially thinned. This forms a circular liquid film removed region 75 on the central portion of the substrate W (see FIG. 9). After the formation of the liquid film removed region 75, the controller 3 controls the rotation speed of the substrate W to maintain the rotation speed at a first rotation speed (for example, about 50 rpm) (rotation step). This gradually expands the liquid film removed region 75 (see FIG. 10). That is, a boundary 80 (hereinafter referred to as "liquid film boundary 80") between the liquid film 70 of water and the liquid film removed region 75 moves outward in the radial direction.

Subsequently, at a predetermined timing, the controller 3 controls the spin motor 13 to increase the rotation speed of the substrate W to a predetermined second rotation speed (for example, about 100 rpm) higher than the first rotation speed, and maintains the rotation speed (rotation step). As the rotation speed of the substrate W increases, the liquid film removed region 75 further expands over the entire upper surface of the substrate W. This also moves the liquid film boundary 80 outward in the radial direction.

After the liquid film removed region 75 expands over the entire upper surface of the substrate W, the controller 3 further accelerates the rotation of the substrate W up to a scattering drying speed (for example, about 1,500 rpm). When a predetermined period has elapsed since the acceleration of the rotation of the substrate W, the controller 3 controls the spin motor 13 to stop rotating the spin chuck 5. Thereafter, the transfer robot CR enters the processing unit 2 and unloads the processed substrate W outside the processing unit 2 (step S5). The transfer robot CR then transfers the substrate W to the transfer robot IR. The transfer robot IR accommodates the substrate W in the carrier C.

In a drying step (S4), the gas discharge nozzle 8 discharges a gas (organic solvent steam and inert gas).

In the drying step (S4), the controller 3 starts executing first discharge step T1 concurrently with the acceleration of the rotation of the substrate W to the first rotation speed. More specifically, the controller 3 opens the first organic solvent steam valve 52 while closing the first inert gas valve 55, and also opens the second inert gas valve 65 while closing the second organic solvent steam valve 62. This will supply high-temperature organic solvent steam from the first organic solvent steam piping 51 to the first gas channel 34, and also supplies an inert gas from the second inert gas piping 64 to the second gas channel 42. With this operation, the first discharge port 36 discharges the high-temperature organic solvent steam in the discharge direction D1, and the second discharge port 40 discharges the inert gas in the discharge direction D2. The high-temperature organic solvent steam discharged from the first discharge port 36 is sprayed on the substantially circular first region 46 (see FIG. 3), and the inert gas discharged from the second discharge port 40 is sprayed on a substantially annular second region 47 (see FIG. 3). In first discharge step T1 according to this preferred embodiment, the discharge flow rate of organic solvent steam discharged from the first discharge port 36 is, for example, about 30 (L/min), and the discharge flow rate of inert gas discharged from the second discharge port 40 is, for example, about 10 (L/min). A region near the upper surface of the substrate W (hereinafter simply referred to as "neighboring region") 11 (see FIG. 9) of the space above the substrate W is filled with the organic solvent steam and the inert gas respectively discharged from the first discharge port 36 and the second discharge port 40.

In first discharge step T1, the rotation speed of the substrate W is maintained at a first rotation speed (about 50 rpm). Subsequently, due to the effect of the centrifugal force generated by the rotation (about 50 rpm rotation) of the substrate W, as described above, the small-diameter liquid film removed region 75 is formed in the region including the rotating center A0 of the upper surface of the substrate W.

Spraying the high-temperature organic solvent steam fills the periphery of the liquid film removed region 75 with the atmosphere of the high-temperature organic solvent steam. With this operation, the high-temperature organic solvent steam is supplied to a portion (hereinafter referred to as "liquid film boundary neighboring portion 70a") of the liquid film 70 of water which is located near the liquid film boundary 80. A thin film 76 of water is formed in the liquid film removed region 75. Because a large amount of organic solvent is dissolved in the thin film 76, the thin film 76 contains the organic solvent at a high concentration. Because the periphery of the liquid film removed region 75 is kept in the atmosphere of the organic solvent steam, the diffusion of the organic solvent steam does not progress. This suppresses or prevents the progress of the evaporation of the organic solvent contained in the thin film 76 of water. Therefore, not all the water can be completely removed from the liquid film removed region 75, and the thin film 76 of water is held in the liquid film removed region 75. In this preferred embodiment, the thin film 76 of water has a thickness on the order of several hundred nm and is set to be lower in height than the pattern P.

The thin film 76 of water is made thick for the following reason. The organic solvent steam discharged from the first discharge port 36 has a temperature (for example, about 80° C.) higher than room temperature (for example, about 23° C.). In contrast, the water discharged from the water nozzle 20 has a temperature equal to room temperature. Consequently, the temperature of the liquid film 70 of water formed on the upper surface of the substrate W is also room temperature. As described above, because the organic solvent steam supplied onto the upper surface of the substrate W has a higher temperature than the liquid film 70 of water, a large amount of organic solvent steam condensates on the upper surface of the substrate W, resulting in an increase in the thickness of the thin film 76 of water in first discharge step T1. That is, in this preferred embodiment, because the organic solvent steam supplied onto the upper surface of the substrate W has a high temperature (for example, about 80° C.), the thickness of the thin film 76 of water is set to be large.

In first discharge step T1, an inert gas is discharged from the second discharge port 40. In first discharge step T1, because the liquid film removed region 75 having a small diameter is present in the region including the rotating center A0 of the substrate W, a bulk portion 92 of the liquid film 70 of water is located in the second region 47. Therefore, discharging an inert gas from the second discharge port 40 makes it possible to cover the upper surface of the bulk portion 92 of the liquid film 70 of water with the inert gas.

As shown in FIG. 14, when the periphery of the liquid film boundary neighboring portion 70a is in an atmosphere of organic solvent steam, a concentration difference in the organic solvent, that is, a surface tension difference, occurs between a portion near the liquid film boundary 80 of the thin film 76 of water (hereinafter referred to as "thin liquid film boundary neighboring portion 76a") and the bulk portion 92 of the liquid film 70 of water. Therefore, the liquid film boundary neighboring portion 70a behaves so as to bulge up as a result of the contraction action of the water due to the Marangoni effect. As a result, a liquid level angle (an angle with respect to a horizontal plane) θ (hereinafter referred to as "liquid level angle θ at the liquid film boundary 80") of water at the liquid film boundary neighboring portion 70a increases.

In first discharge step T1, because the upper surface of the bulk portion 92 of the liquid film 70 of water is covered with the inert gas, the organic solvent steam is supplied to only the liquid film boundary neighboring portion 70a, and high-temperature organic solvent steam is adopted as the organic solvent steam. This can increase the concentration difference in organic solvent steam between the liquid film boundary neighboring portion 70a and the bulk portion 92 of the liquid film 70 of water, and hence can increase the surface tension difference between the liquid film boundary neighboring portion 70a and the bulk portion 92 of the liquid film 70 of water. Therefore, the Marangoni effect acting on the liquid film 70 of water is enhanced, resulting in a further increase in the liquid level angle θ at the liquid film boundary 80.

As described above, even after the formation of the liquid film removed region 75, the rotation speed of the substrate W is maintained at the first rotation speed (for example, about 50 rpm). This expands the liquid film removed region 75 to some extent. With this expansion of the liquid film removed region 75, the liquid film boundary 80 moves outward in the radial direction of the substrate W. In this case, as shown in FIG. 10, the liquid film boundary 80 sometimes protrudes outward from the first region 46.

In this case, however, as shown in FIG. 10, due to the specific gravity difference between the organic solvent and the inert gas, the organic solvent steam flows at a lower position in the neighboring region 11 which is located near the upper surface of the substrate W, and the inert gas flows at a higher position in the neighboring region 11 which is located away from the upper surface of the substrate W. This makes it possible to move the organic solvent steam discharged from the first discharge port 36 toward the outside, near the upper surface of the substrate W, along the upper surface, and to cause the organic solvent steam to collide with the liquid film boundary 80. Therefore, even after the liquid film boundary 80 moves outside the first region 46, it is possible to keep sufficiently supplying the organic solvent steam to the liquid film boundary 80.

According to the above description, the start timing of first discharge step T1 is the same as the acceleration timing of the substrate W to the first rotation speed. However, the start timing may be earlier than the acceleration timing of the substrate W to the first rotation speed.

The controller 3 also starts executing second discharge step T2 in parallel with the acceleration of the substrate W to the second rotation speed. More specifically, the controller 3 closes the first organic solvent steam valve 52 and opens the first inert gas valve 55. Further, the controller 3 closes the second inert gas valve 65 and opens the second organic solvent steam valve 62. Consequently, an inert gas from the first inert gas piping 54 is supplied to the first gas channel 34, and high-temperature organic solvent steam from the second organic solvent steam piping 61 is supplied to the second gas channel 42. With this operation, the inert gas is discharged from the first discharge port 36 in the discharge direction D1, and the high-temperature organic solvent steam is discharged from the second discharge port 40 in the discharge direction D2. The inert gas discharged from the first discharge port 36 is sprayed on the substantially circular first region 46 (see FIG. 3). The high-temperature organic solvent steam discharged from the second discharge port 40 is sprayed on the substantially annular second region 47 (see FIG. 3). In second discharge step T2 according to this preferred embodiment, the discharge flow rate of inert gas discharged from the first discharge port 36 is, for example, about 30 (L/min), and the discharge flow rate of organic solvent steam discharged from the second discharge port 40 is, for example, about 100 (L/min).

In second discharge step T2, the rotation speed of the substrate W is maintained at a second rotation speed (about 100 rpm). This expands the liquid film removed region 75 over the entire region of the substrate W. As the liquid film removed region 75 expands, the liquid film boundary 80 moves outward in the radial direction of the substrate W.

In second discharge step T2, a high-temperature organic solvent steam is discharged from the second discharge port 40 outward obliquely downward. Because an organic solvent has a larger specific gravity than air, the organic solvent steam discharged from the second discharge port 40 moves at a lower position in the neighboring region 11 which is located near the upper surface of the substrate W outward along the upper surface, and collides with the liquid film boundary 80. This makes it possible to sufficiently supply the organic solvent steam to the liquid film boundary 80 in second discharge step T2. Further, because both the moving direction of the organic solvent steam and the moving direction of the liquid film boundary 80 collides with each other in a radially outward direction, it is possible to keep supplying the high-temperature organic solvent steam to the liquid film boundary 80 regardless of the moving state of the liquid film boundary 80.

In second discharge step T2 as well, the organic solvent steam supplied to the upper surface of the substrate W has a higher temperature than the liquid film 70 of water. For this reason, a large amount of organic solvent steam condensates on the upper surface of the substrate W, resulting in an increase in the thickness of the thin film 76 of water. Consequently, the thin film 76 of water has a thickness on the order of several hundred nm as in first discharge step T1.

In second discharge step T2 as well, an inert gas is discharged from the first discharge port 36 toward the first region 46 on the upper surface of the substrate W. Supplying the inert gas to the first region 46 on the upper surface of the substrate W will replace the atmosphere at the central portion of the upper surface of the substrate W with the inert gas, thereby promoting the evaporation of the organic solvent steam contained in the thin film 76 of water. With this operation, the thin film of water is removed from the central portion of the upper surface of the substrate W, and the central portion of the upper surface of the substrate W is dried.

The inert gas supplied to the first region 46 pushes and spreads the organic solvent steam discharged toward the second region 47 outward in the radial direction. With this operation, the organic solvent steam discharged from the first discharge port 36 and moved, near the upper surface of the substrate W, along the upper surface can be pressed on the liquid film boundary 80. This can keep the periphery of the liquid film boundary neighboring portion 70a in the atmosphere of the organic solvent steam. In this case, adopting a gas having a larger specific gravity such as argon gas as the inert gas discharged from the gas discharge nozzle 8 makes it easier to push and spread the organic solvent steam.

As described above, because the organic solvent steam supplied to the upper surface of the substrate W has a higher temperature than the liquid film 70 of water, a large amount of organic solvent steam condensates on the upper surface of the substrate W. Due to the condensation of the organic solvent steam, when the thickness of the thin liquid film boundary neighboring portion 76a exceeds the height of the pattern P, the patters P may collapse accompanying the movement of the liquid film boundary 80 (expansion of the liquid film removed region 75).

In second discharge step T2, however, when the inert gas discharged from the first discharge port 36 pushes and spreads the liquid film removed region 75, the movement of the liquid film boundary 80 is promoted. With this operation, before the thickness of the thin liquid film boundary neighboring portion 76a increases, the liquid film boundary 80 can be moved to the outer peripheral edge of the substrate W (that is, the liquid film removed region 75 is spread over the entire upper surface of the substrate W). Therefore, before patterns P collapse, water can be removed (dried) from the entire upper surface of the substrate W.

According to the above description, the start timing of second discharge step T2 is the same as the acceleration timing of the substrate W to the second rotation speed. However, the start timing may be earlier than the acceleration timing of the substrate W to the second rotation speed.

When a predetermined period (for example, 5 sec) has elapsed since the start of second discharge step T2, the liquid film removed region 75 has already expanded over the entire upper surface of the substrate W. At this timing, the controller 3 accelerates the rotation of the substrate W to a scattering speed (for example, about 1,500 rpm). That is, the controller 3 starts executing spin-drying step T3.

The controller 3 also starts executing spin-drying step T3 in parallel with the acceleration of the substrate W to the scattering drying speed (for example, about 1,500 rpm). More specifically, the controller 3 closes the second organic solvent steam valve 62 and opens the second inert gas valve 65 while maintaining the closed state of the first organic solvent steam valve 52 and the open state of the first inert gas valve 55. This causes both the first discharge port 36 and the second discharge port 40 to discharge an inert gas. The inert gas discharged from the first discharge port 36 is sprayed on the substantially circular first region 46 (see FIG. 3), and the inert gas discharged from the second discharge port 40 is sprayed on the substantially annular second region 47 (see FIG. 3).

When spin-drying step T3 is finished, the controller 3 controls the third nozzle moving unit 24 to retract the gas discharge nozzle 8 to the retracted position at which the gas discharge nozzle 8 is pulled to above the central portion of the substrate W.

With the above operation, according to this preferred embodiment, in first discharge step T1, organic solvent steam is discharged from the first discharge port 36 toward the first region 46 on the upper surface of the substrate W, and an inert gas is discharged from the second discharge port 40 toward the second region 47 surrounding the first region 46.

In first discharge step T1, while the substrate W is rotated, organic solvent steam is supplied to a region including the rotating center A0 of the upper surface of the substrate W. Upon reception the centrifugal force generated by the rotation (50 rpm rotation) of the substrate W, water in the region including the rotating center A0 of the upper surface of the substrate W is pushed and spread outward. As a result, the liquid film 70 of water in a region including the rotating center A0 of the upper surface of the substrate W is partially thinned. This forms the liquid film removed region 75 in the central portion of the substrate W. The thin film 76 of water continuous with the liquid film boundary neighboring portion 70a is held in the liquid film removed region.

When the periphery of the liquid film boundary neighboring portion 70a is in an atmosphere of an organic solvent steam, a concentration difference in the organic solvent, that is, a surface tension difference, occurs between the thin liquid film boundary neighboring portion 76a and the bulk portion 92 of the liquid film 70 of water. Therefore, the liquid film boundary neighboring portion 70a behaves so as to bulge up as a result of the contraction action of water due to the Marangoni effect. As a result, the liquid level angle θ at the liquid film boundary 80 increases.

In this preferred embodiment, when the liquid film removed region 75 is relatively small, the execution of first discharge step T1 is started. Thereafter, at a predetermined timing during the expansion of the liquid film removed region 75, the execution of first discharge step T1 is stopped, and the execution of second discharge step T2 is started. That is, at the timing when the expansion of the liquid film removed region 75 has progressed to some extent, the discharge port from which an organic solvent is to be discharged is switched from the first discharge port 36 to the second discharge port 40. This makes it possible to move the supply position of organic solvent steam on the upper surface of the substrate W following the movement of the liquid film boundary 80 accompanying the expansion of the liquid film removed region 75. Therefore, it is possible to keep the periphery of the liquid film boundary neighboring portion 70a in an atmosphere of the organic solvent steam over a period from the formation of the liquid film removed region 75 to the expansion of the liquid film removed region 75 over the entire region of the substrate W. This makes it possible to keep the large liquid level angle θ at the liquid film boundary 80 over the period. It is, therefore, possible to remove water from the upper surface of the substrate W while suppressing or preventing the collapse of the patterns P.

Adopting the substrate processing method according to this preferred embodiment can also prevent the liquid level angle θ at the liquid film boundary 80 from becoming too small even when the upper surface of the substrate W exhibits hydrophilic properties (for example, when each pattern P (see FIG. 5) is a hydrophilic film). Even if, therefore, the upper surface of the substrate W exhibits hydrophilic properties, it is possible to remove water from the upper surface of the substrate W while suppressing the collapse of the patterns P.

Because the organic solvent steam supplied onto the upper surface of the substrate W has a higher temperature than the liquid film 70 of water, the condensation amount of organic solvent steam on the upper surface of the substrate W increases in first discharge step T1 and second discharge step T2, resulting in an increase in the thickness of the thin film 76 (on the order of several hundred nm) of water. This increases the concentration difference in organic solvent steam between the liquid film boundary neighboring portion 70a and the bulk portion 92 of the liquid film 70 of water, and hence increases the surface tension difference between the liquid film boundary neighboring portion 70a and the bulk portion 92 of the liquid film 70 of water. Therefore, the Marangoni effect acting on the liquid film 70 of water is enhanced, resulting in a further increase in the liquid level angle θ at the liquid film boundary 80. It is, therefore, possible to keep the larger liquid level angle θ at the liquid film boundary 80 over a period from the formation of the liquid film removed region 75 to the expansion of the liquid film removed region 75 over the entire upper surface of the substrate W.

In second discharge step T2, organic solvent steam is discharged from the second discharge port 40 outward obliquely downward. Because an organic solvent has a larger specific gravity than air, the organic solvent steam discharged from the second discharge port 40 moves at a lower position in the neighboring region 11 which is located near the upper surface of the substrate W outward along the upper surface, and collides with the liquid film boundary 80. This makes it possible to sufficiently supply the organic solvent steam to the liquid film boundary 80. Further, because both the moving direction of the organic solvent steam and the moving direction of the liquid film boundary 80 coincide with each other in a radially outward direction, it is possible to keep supplying the organic solvent steam to the liquid film boundary 80 regardless of the moving state of the liquid film boundary 80.

Assume that the gas discharge nozzle 8 discharges high-temperature organic solvent steam. In this case, as the condensation amount of organic solvent steam on the upper surface of the substrate W increases, the thickness of the thin liquid film boundary neighboring portion 76a may increase. When the thickness of the thin liquid film boundary neighboring portion 76a exceeds the height of the pattern P, the patterns P may collapse accompanying the movement of the liquid film boundary 80 (expansion of the liquid film removed region 75).

In this preferred embodiment, in second discharge step T2, an inert gas is discharged from the first discharge port 36 to push and spread the liquid film removed region 75, thereby promoting the movement of the liquid film boundary 80. This makes it possible to move the liquid film boundary 80 to the outer peripheral edge of the substrate W (that is, to expand the liquid film removed region 75 over the entire upper surface of the substrate W) before the thickness of the thin liquid film boundary neighboring portion 76a increases. Therefore, before the patterns P collapse, water can be removed (dried) from the entire upper surface of the substrate W.

Figure 15:
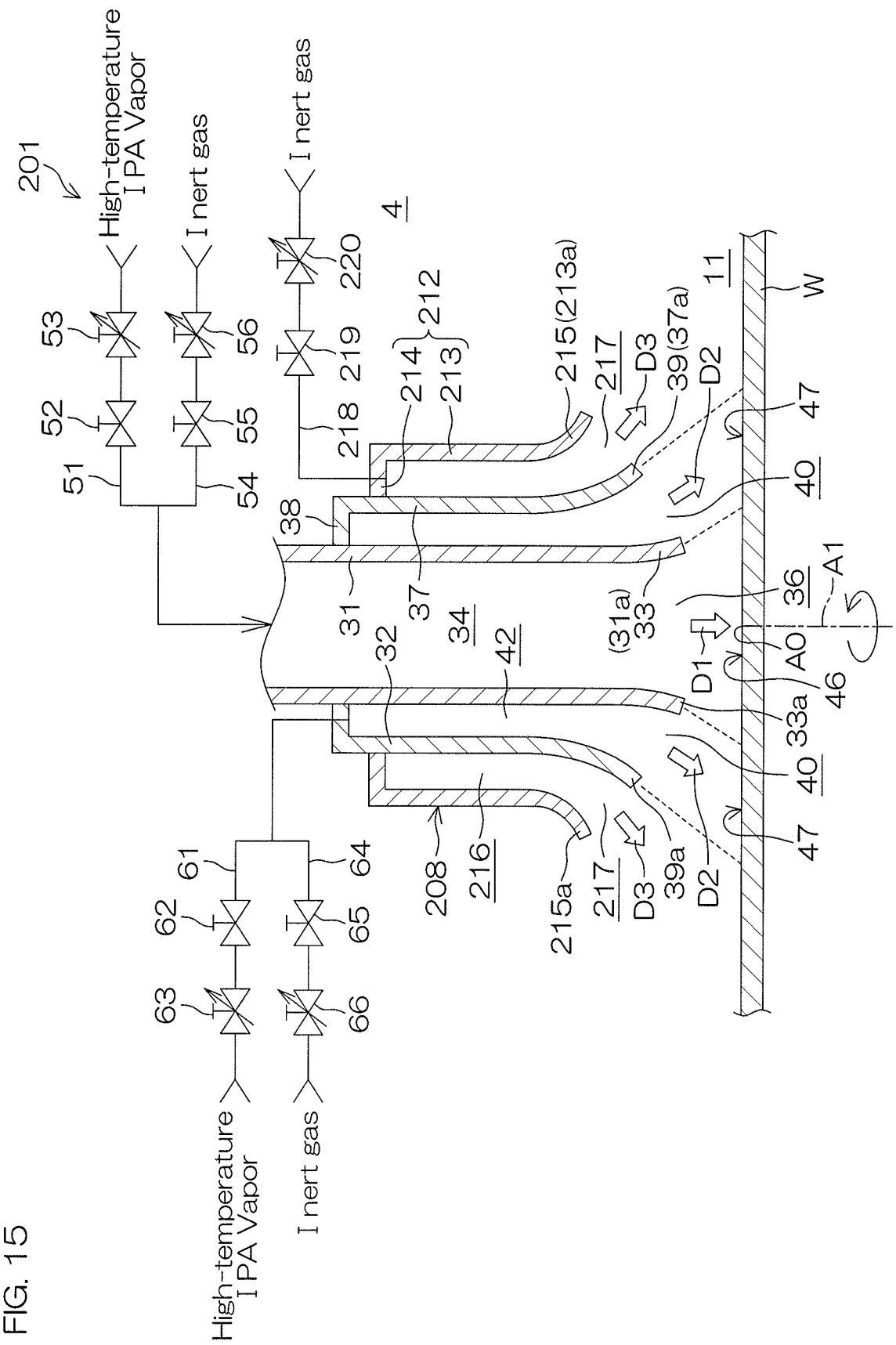
FIG. 15 is a schematic longitudinal sectional view for explaining an example of the arrangement of a gas discharge nozzle provided for a substrate processing apparatus that executes a substrate processing method according to the second preferred embodiment of the present invention.

FIG. 15 is a schematic longitudinal sectional view for explaining an example of the arrangement of a gas discharge nozzle 208 provided for a substrate processing apparatus 201 that executes a substrate processing method according to the second preferred embodiment of the present invention.

In the second preferred embodiment, the same reference signs as in FIGS. 1 to 13 denote the same portions as those in the first preferred embodiment, and a description of the portions will be omitted.

The gas discharge nozzle 208 included in the substrate processing apparatus 201 according to the second preferred embodiment differs from the gas discharge nozzle 8 included in the substrate processing apparatus 1 according to the first preferred embodiment in that a triple-cylinder gas discharge nozzle is formed by surrounding a second gas channel 42 with an annular third gas channel 216.

More specifically, the gas discharge nozzle 208 further includes a third cylinder (outer cylinder) 212 surrounding a second cylinder 32. The central axis of the third cylinder 212 is the central axis A2. The third cylinder 212 includes a cylindrical portion 213 and a closed portion 214 that closes the upper end portion of the cylindrical portion 213. A seal member (not shown) airtightly seals between the outer circumference of the second cylinder 32 and the inner circumference of the closed portion 214. A lower end portion 213a of the cylindrical portion 213 includes a third trumpet-shaped portion 215 spreading out downward. The third trumpet-shaped portion 215 has a higher bending rate than a second trumpet-shaped portion 39. A lower end portion 215a of the third trumpet-shaped portion 215 has a larger inclination angle with respect to the vertical direction than a lower end portion 39a of the second trumpet-shaped portion 39. The lower end portion 39a of the third trumpet-shaped portion 215 is located higher than the lower end portion 39a of the second trumpet-shaped portion 39. The space between the second cylinder 32 and the cylindrical portion 213 of the third cylinder 212 defines the third gas channel 216 through which an inert gas supplied from a third inert gas piping 218 is circulated.

In the lower end portion of the third gas channel 216, an annular third discharge port 217 facing outward obliquely downward is defined by the lower end portion 39a of the second trumpet-shaped portion 39 and the lower end portion 215a of the third trumpet-shaped portion 215. The third discharge port 217 discharges an inert gas circulating through the third gas channel 216 annularly and outward obliquely downward. Because the lower end portion 215a of the third trumpet-shaped portion 215 is larger in inclination angle with respect to the vertical direction than the lower end portion 39a of the second trumpet-shaped portion 39, the inclination angle of a discharge direction D3 of a gas from the third discharge port 217 with respect to the vertical direction is larger than the inclination angle of a discharge direction D2 of a gas from the second discharge port 40 with respect to the vertical direction. In other words, the degree of inclination of the discharge direction D3 of a gas from the third discharge port 217 with respect to the vertical direction is larger than that of the discharge direction D2 of a gas from the second discharge port 40 with respect to the vertical direction.

The third inert gas piping 218 is connected to the third gas channel 216 of the gas discharge nozzle 208 to which an inert gas (for example, at least one of nitrogen gas, argon gas, and helium gas) from the inert gas source is supplied. A third inert gas valve 219 and a fourth flow rate adjusting valve 220 are interposed in the third inert gas piping 218. The third inert gas valve 219 is used to open and close the third inert gas piping 218. The fourth flow rate adjusting valve 220 is used to adjust the flow rate of inert gas discharged from the third discharge port 217 by adjusting the degree of opening of the third inert gas piping 218. Opening the third inert gas valve 219 will supply an inert gas from the third inert gas piping 218 to the third gas channel 216. The inert gas that has flown to the third gas channel 216 and reached the lower end of the third gas channel 216 is discharged from the third discharge port 217.

According to the above description, the discharge direction D3 of a gas from the third discharge port 217 is an outward obliquely downward direction. However, this direction may be an outward direction (that is, a lateral direction).

Figure 16:
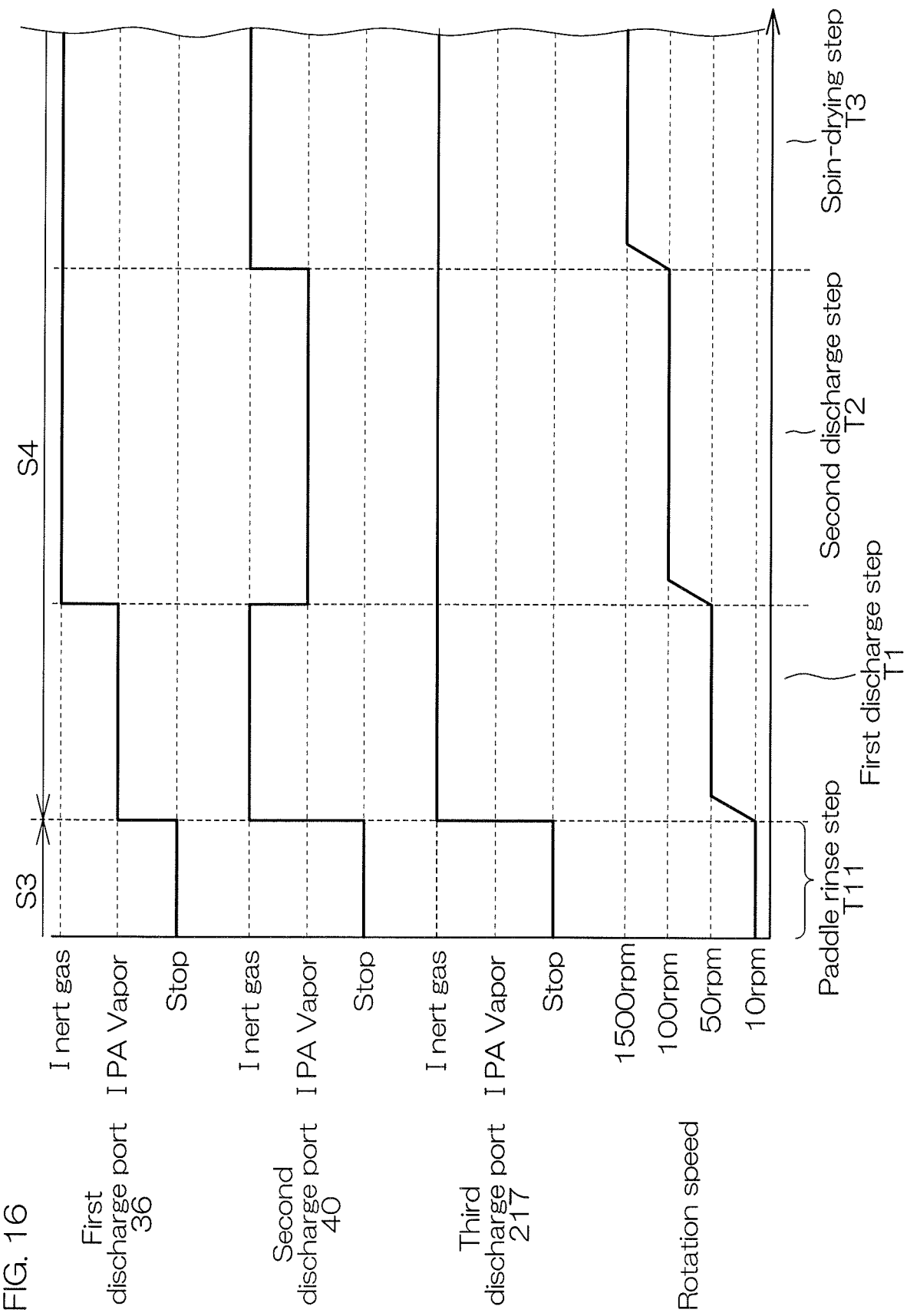
FIG. 16 is a timing chart for explaining a rinse step and a spin-drying step in an example of substrate processing by the substrate processing apparatus.

FIG. 16 is a timing chart for explaining a rinse step and a spin-drying step in an example of substrate processing by the substrate processing apparatus 201.

An example of substrate processing by the substrate processing apparatus 201 is similar to the substrate processing example performed by the substrate processing apparatus 1 described with reference to FIG. 6A in terms of discharge control on gases from the first discharge port 36 and the second discharge port 40, and hence a description of the control will be omitted.

More specifically, when first discharge step T1 starts after the gas discharge nozzle 8 is located at a lower position, a controller 3 opens the third inert gas valve 219 to discharge an inert gas from the third discharge port 217 in the discharge direction D3. The inert gas discharged from the third discharge port 217 is sprayed on an annular region outside a second region 47. The third discharge port 217 keeps discharging the inert gas until the end of spin-drying step T3.

The second preferred embodiment implements similar functions and effects as those described in the first preferred embodiment.

Figure 17:
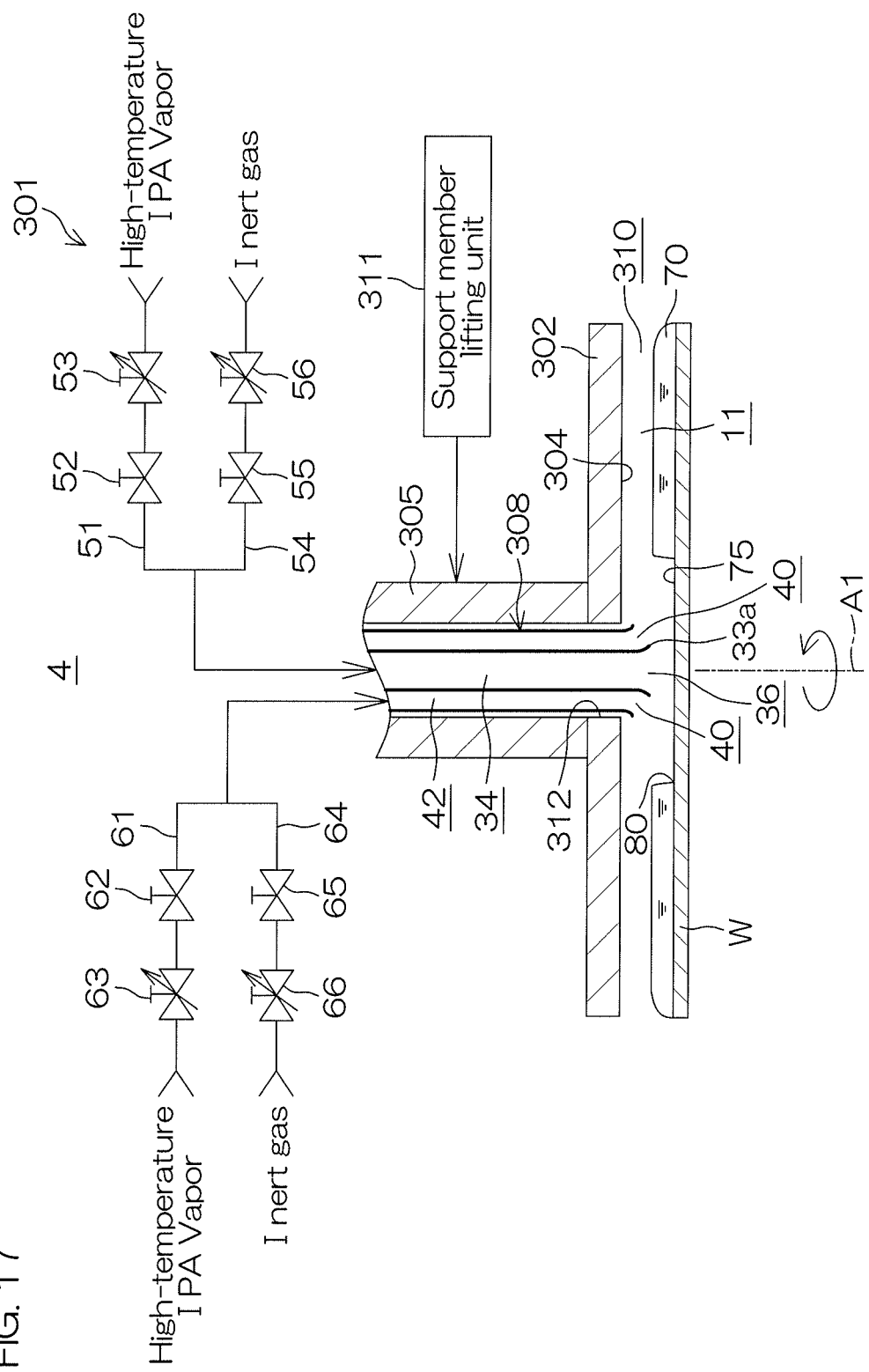
FIG. 17 is an illustrative view for explaining the arrangement of a substrate processing apparatus that executes a substrate processing method according to the third preferred embodiment of the present invention.

FIG. 17 is an illustrative view for explaining the arrangement of a substrate processing apparatus 301 that executes a substrate processing method according to a third preferred embodiment of the present invention.

In the third embodiment, the same reference signs as in FIGS. 1 to 14 denote the same portions as those in the first preferred embodiment, and a description of the portions will be omitted. The substrate processing apparatus 301 according to the third preferred embodiment mainly differs from the substrate processing apparatus 1 according to the first preferred embodiment in that an opposed member 302 is provided so as to oppose the upper surface of the substrate W held by a spin chuck 5, and a gas discharge nozzle 308 is integrally movably provided on the opposed member 302.

The opposed member 302 has a disk shape. The diameter of the opposed member 302 is almost equal to or larger than the diameter of a substrate W. A circular opposed surface 304 formed from a flat surface is formed on the lower surface of the opposed member 302 so as to oppose the upper surface of the substrate W held by the spin chuck 5. The opposed surface 304 opposes the entire upper surface of the substrate W. A holder 305 supports the opposed member 302 in a horizontal posture so as to locate the central axis of the opposed member 302 at a position on a rotating axis A1 of the spin chuck 5.

The holder 305 having a hollow cylindrical shape is fixed on the upper surface of the opposed member 302 so as to have a central axis coinciding with a vertical axis (coinciding with the rotating axis A1 of the spin chuck 5) passing through the center of the opposed member 302. The holder 305 is formed into a hollow shape, through which the gas discharge nozzle 308 extends in the vertical direction. The gas discharge nozzle 308 has substantially the same arrangement as that of the gas discharge nozzle 8 (see FIG. 3 and the like) according to the first preferred embodiment.

The gas discharge nozzle 308 protrudes lower than the opposed surface 304 through a through hole 312 formed in the central portion of the opposed member 302. The gas discharge nozzle 308 has first and second discharge ports 36 and 40 that are positioned with respect to the opposed member 302 so as to be exposed lower than the opposed surface 304. More specifically, there is a slight gap between the opposed surface 304 and the upper end of the second discharge port 40.

A support member lifting unit 311 is coupled to the holder 305. A controller 3 controls the support member lifting unit 311 to vertically move the opposed surface 304 of the opposed member 302 between a proximity position at which the opposed surface 304 of the opposed member 302 approaches the upper surface of the substrate W held by the spin chuck 5 and a retracted position at which the opposed surface 304 is greatly retracted above the spin chuck 5. When the opposed member 302 is located at the proximity position, a lower end portion 33a of a first trumpet-shaped portion 33 faces the upper surface of the substrate W through a predetermined interval (for example, about 7 mm). Further, a small gap (for example, about 10 mm) is set between the opposed surface 304 and the upper surface of the substrate W.

The substrate processing apparatus 301 according to the third preferred embodiment executes processing similar to the substrate processing example (the substrate processing example shown in FIGS. 6A to 13) according to the first preferred embodiment. In the drying step (step S4 in FIG. 6A), the controller 3 controls the support member lifting unit 311 to locate the opposed member 302 at the proximity position. Subsequently, the gas discharge nozzle 308 discharges organic solvent steam and an inert gas. The discharge timing and the like of gases from the first and second discharge ports 36 and 40 of the gas discharge nozzle 308 and the form of rotation of the substrate W are similar to those in the substrate processing example (the substrate processing example shown in FIGS. 6A to 13) according to the first preferred embodiment. Consequently, the third embodiment has effects similar to those described in association with the first preferred embodiment.

In addition to having the functions and effects associated with organic solvent steam and an inert gas from the gas discharge nozzle 308 according to the first preferred embodiment, the third preferred embodiment can cut off a narrow space 310 (that is, a neighboring region 11) above the substrate W from the periphery of the substrate W and hence makes the currents of organic solvent steam and an inert gas flowing in the neighboring region 11 resistant to the influences of disturbance. This makes it possible to stably keep the currents of organic solvent steam and an inert gas over a period from the formation of a liquid film removed region 75 to the expansion of the liquid film removed region 75 over the entire region of the substrate W.

Although the three preferred embodiments of the present invention have been described above, this invention can also be carried out in other modes.

For example, in each preferred embodiment, the discharge flow rate of organic solvent steam from the first discharge port 36 in second discharge step T2 may be increased after the start of discharging. In this case, it is possible to keep supplying organic solvent steam to the liquid film boundary 80 moving away from the rotating center A0 accompanying the expansion of the liquid film removed region 75.

Each preferred embodiment described above has exemplified the arrangement to cause the gas discharge nozzle 8, 208, or 308 to discharge organic solvent steam as a low surface tension liquid containing gas. However, each preferred embodiment may be arranged to discharge a gas mixture of organic solvent steam and an inert gas (for example, nitrogen gas) as a carrier gas.

In each preferred embodiment described above, assume that the organic solvent steam discharged from the gas discharge nozzle 8, 208, or 308 is organic solvent steam having a temperature higher than room temperature, and the gas discharge nozzle 8, 208, or 308 may be arranged to discharge organic solvent steam having room temperature. In this case, making the liquid film 70 of water formed on the upper surface of the substrate W have a liquid temperature lower than room temperature will make organic solvent steam supplied onto the upper surface of the substrate W have a higher temperature than the liquid film 70 of water. In this case, this makes it possible to keep the thin film 76 of water thick, which is formed on the upper surface of the substrate W in first discharge step T1 and second discharge step T2.

In first discharge step T1 and/or second discharge step T2, water may be supplied to a peripheral edge portion of the substrate W (the bulk portion 92 of the liquid film 70 of water) by using the water nozzle 20 (see FIG. 2) or the like in parallel with discharging of a gas from the gas discharge nozzle 8, 208, or 308. In this case, it is necessary to stop supplying water at a predetermined timing before the expanding liquid film removed region 75 covers the entire upper surface of the substrate W (that is, before the liquid film boundary 80 reaches the peripheral edge of the upper surface of the substrate W) so as to prevent water from being supplied to the liquid film removed region 75.

In each preferred embodiment described above, in first discharge step T1, no inert gas may be discharged from the second discharge port 40. In this case, the neighboring region 11 is filled with an atmosphere of organic solvent steam. For this reason, after the gas discharge nozzle 8, 208, or 308 is disposed at a lower position, the neighboring region 11 is preferably filled with an inert gas by discharging the inert gas from the first discharge port 36, the second discharge port 40, and the third discharge port 217. In this case, in first discharge step T1, the upper surface of the bulk portion 92 of the liquid film 70 of water can be covered with the inert gas. This makes it possible to supply organic solvent steam to only the liquid film boundary neighboring portion 70a.

The arrangement according to the third preferred embodiment may be combined with the arrangement of the second preferred embodiment. That is, the gas discharge nozzle 208 formed into a triple-cylinder nozzle may be incorporated in the opposed member 302 according to the third preferred embodiment.

Although a total of three gas discharge nozzle forms including the gas discharge nozzles 8, 208, and 308 have been exemplified in the first to third preferred embodiments, gas discharge nozzles may have other forms.

That is, the gas discharge nozzles 8, 208, and 308 described in the above preferred embodiments are arranged such that the plurality of discharge ports located further outside are disposed at higher positions. However, all the discharge ports may be disposed at the same height position. Further, the gas discharge nozzles 8, 208, and 308 described in the respective preferred embodiments are arranged such that the plurality of discharge ports located further outside have larger inclination angles of the discharging directions of a gas from the discharge ports with respect to the vertical direction. However, the discharging directions of a gas from all the discharge ports may coincide with each other (for example, a vertical downward direction).

The gas discharge nozzles to be used are not limited to double-cylinder nozzles or triple-cylinder nozzles, and multiple-cylinder nozzles including quadruple- or more-cylinder nozzles may be adopted.

According to the above preferred embodiments, in first discharge step T1, the organic solvent steam (the organic solvent steam supplied onto the upper surface of the substrate W) discharged from the first discharge port 36 has a high temperature (about 80° C.). However, in first discharge step T1, room-temperature organic solvent steam or organic solvent steam having a predetermined temperature (for example, about 30° C. to about 60° C.) equal to or more than room temperature and less than a boiling point (82.4° C.) may be discharged from the first discharge port 36. In this case, the thin film 76 of water formed in the liquid film removed region 75 has a thickness of several nm.

In this case, the concentration difference in the low surface tension liquid between the liquid film boundary neighboring portion 70a and the bulk portion 92 of the liquid film 70 of water is not larger than that in each embodiment described above. However, there is a surface tension difference between the liquid film boundary neighboring portion 70a and the bulk portion 92 of the liquid film 70 of water. This can exert the Marangoni effect on the liquid film 70 of water. For this reason, the liquid film boundary neighboring portion 70a behaves so as to bulge up. It is, therefore, possible to keep the larger liquid level angle θ at the liquid film boundary 80 over a period from the formation of the liquid film removed region 75 to the expansion of the liquid film removed region 75 over the entire surface of the substrate W.

In each embodiment described above, the rotation speed (second rotation speed) of the substrate W in second discharge step T2 may be set to be almost equal to the rotation speed (first rotation speed) of the substrate W in first discharge step T1.

Although IPA that is an example of organic solvents has been exemplified as a low surface tension liquid having a larger specific gravity than air and a lower surface tension than water, organic solvents, other than IPA, for example, such as methanol, ethanol, acetone, ethylene glycol (EG), hydro fluoro ether (HFE), n-butanol, t-butanol, isobutyl alcohol, and 2-butanol can be adopted as such low surface tension liquids.

Each preferred embodiment described above has exemplified the case in which a processing liquid forming a liquid film of the processing liquid (the liquid film 70 of water) is water. However, a processing liquid forming a liquid film may be IPA (liquid). In this case, as a low surface tension liquid, HFE or EG can be adopted.

Each preferred embodiment described above has exemplified the case in which the substrate processing apparatuses 1, 201, and 301 are apparatuses that process the disk-shaped substrates W. However, the substrate processing apparatuses 1, 201, and 301 may be apparatuses that process polygonal substrates such as glass substrates for liquid crystal displays.

Although the preferred embodiments of the present invention have been described in detail above, these are merely specific examples used to clarify the technical contents of the present invention, and the present invention should not be interpreted as being limited only to these specific examples, and the scope of the present invention is limited only by the appended claims.

The present application corresponds to Japanese Patent Application No. 2016-14567 filed on Jan. 28, 2016 in the Japan Patent Office, and the entire disclosure of the present application is incorporated herein by reference.

REFERENCE SIGNS LIST

1: Substrate processing apparatus
3: Controller
8: Gas discharge nozzle
24: Third nozzle moving unit
34: First gas channel
36: First discharge port
40: Second discharge port
42: Second gas channel
46: First region
47: Second region
52: First organic solvent steam valve
55: First inert gas valve
62: Second organic solvent steam valve
65: Second inert gas valve
70: Liquid film of water
75: Liquid film removed region 76: Thin film of water
80: Liquid film boundary
92: Bulk portion
201: Substrate processing apparatus
208: Gas discharge nozzle
216: Third gas channel
217: Third discharge port
219: Third inert gas valve
A0: Rotating center
A1: Rotating axis
W: Substrate

What is claimed is:

1. A substrate processing method comprising:
a substrate holding step of horizontally holding a substrate having an upper surface on which patterns are formed;
a liquid film forming step of forming a liquid film of a processing liquid thicker than a height of the patterns on an upper surface of the substrate;
a discharge port positioning step of positioning a first discharge port and a second discharge port at respective fixed positions which are set such that the first discharge port faces a predetermined first region including a rotating center of an upper surface of the substrate and the second discharge port faces a predetermined second region which is an annular region surrounding the outside of the first region on an upper surface of the substrate;
a first discharge step of discharging, from the first discharge port, a low surface tension liquid containing gas containing steam of a low surface tension liquid having a larger specific gravity than air and lower surface tension than the processing liquid and not discharging the low surface tension liquid containing gas from the second discharge port;
a second discharge step of discharging the low surface tension liquid containing gas from the second discharge port after the first discharge step and not discharging the low surface tension liquid containing gas from the first discharge port; and
a rotation step of rotating the substrate around a predetermined vertical axis in parallel with the first and second discharge steps,
wherein the first discharge port and the second discharge port are stationarily placed at the respective fixed positions throughout the first discharge step and the second discharge step and until the liquid film of the processing liquid has been removed from the upper surface of the substrate.

2. The substrate processing method according to claim 1, wherein a discharging direction of a gas discharged from the first discharge port includes a vertical downward direction, and
a discharging direction of a gas discharged from the second discharge port includes an outward obliquely downward direction.

3. The substrate processing method according to claim 1, wherein the low surface tension liquid containing gas has a temperature higher than room temperature.

4. The substrate processing method according to claim 1, wherein the second discharge step includes a step of discharging, from the first discharge port, an inert gas that does not include steam of the low surface tension liquid and has a smaller specific gravity than the low surface tension liquid.

5. The substrate processing method according to claim 1, wherein the first discharge step includes a step of discharging, from the second discharge port, an inert gas that does not include steam of the low surface tension liquid and has a smaller specific gravity than the low surface tension liquid.

6. The substrate processing method according to claim 1, wherein the processing liquid includes water, and
the low surface tension liquid includes an organic solvent.

* * * * *